(12) United States Patent
Matsudai et al.

(10) Patent No.: US 12,300,695 B2
(45) Date of Patent: May 13, 2025

(54) SEMICONDUCTOR DEVICE AND SEMICONDUCTOR CIRCUIT

(71) Applicants: Kabushiki Kaisha Toshiba, Tokyo (JP); Toshiba Electronic Devices & Storage Corporation, Tokyo (JP)

(72) Inventors: Tomoko Matsudai, Tokyo (JP); Yoko Iwakaji, Tokyo (JP); Hiroko Itokazu, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 353 days.

(21) Appl. No.: 17/473,579

(22) Filed: Sep. 13, 2021

(65) Prior Publication Data

US 2022/0293592 A1 Sep. 15, 2022

(30) Foreign Application Priority Data

Mar. 12, 2021 (JP) .................................. 2021-040092

(51) Int. Cl.
*H01L 27/07* (2006.01)
*H01L 29/06* (2006.01)
(Continued)

(52) U.S. Cl.
CPC ........ *H01L 27/0727* (2013.01); *H01L 29/063* (2013.01); *H01L 29/7397* (2013.01); *H01L 29/868* (2013.01); *H03K 17/08128* (2013.01)

(58) Field of Classification Search
CPC ............. H01L 29/7804; H01L 29/7805; H01L 29/7395–7397; H01L 29/66333–66348;
(Continued)

(56) References Cited

U.S. PATENT DOCUMENTS 8,710,585 B1 * 4/2014 Hu .......................... H01L 29/36
257/490
9,496,332 B1 11/2016 Matsushita
(Continued)

FOREIGN PATENT DOCUMENTS

JP 2009-141202 A 6/2009
JP 2013-197122 A 9/2013
(Continued)

*Primary Examiner* — Jesse Y Miyoshi
*Assistant Examiner* — Ricky Verdes
(74) *Attorney, Agent, or Firm* — Maier & Maier, PLLC

(57) ABSTRACT

A semiconductor device of embodiments includes: a semiconductor layer including a first trench, a second trench, a first semiconductor region of a first conductive type, a second semiconductor region of a second conductive type provided between a first face and the first semiconductor region, between the first trench and the second trench, and in contact with the second trench, a third semiconductor region of a first conductive type provided between the first trench and the second semiconductor region, a fourth semiconductor region of a second conductive type provided between the third semiconductor region and the first face, and a fifth semiconductor region of a second conductive type provided between the second semiconductor region and the first face, spaced from the fourth semiconductor region, in contact with the second trench; a first electrode on a first face side; and a second electrode on a second face side.

3 Claims, 16 Drawing Sheets

(51) Int. Cl.
*H01L 29/739* (2006.01)
*H01L 29/868* (2006.01)
*H03K 17/0812* (2006.01)

(58) Field of Classification Search
CPC ... H01L 27/0664; H01L 27/0761–0766; H01L 27/0629
See application file for complete search history.

(56) References Cited

U.S. PATENT DOCUMENTS

| | | | |
|---|---|---|---|
| 9,853,024 | B2 | 12/2017 | Senoo et al. |
| 2013/0240947 | A1 | 9/2013 | Mastsudai et al. |
| 2014/0048847 | A1* | 2/2014 | Yamashita .......... H01L 29/7806 257/140 |
| 2014/0061875 | A1 | 3/2014 | Ogura et al. |
| 2014/0070266 | A1 | 3/2014 | Matsudai et al. |
| 2014/0124832 | A1 | 5/2014 | Ogura et al. |
| 2014/0284658 | A1 | 9/2014 | Mastsudai et al. |
| 2015/0263148 | A1 | 9/2015 | Ogura et al. |
| 2015/0263149 | A1 | 9/2015 | Ogura et al. |
| 2016/0276498 | A1 | 9/2016 | Ogura et al. |
| 2017/0077089 | A1 | 3/2017 | Ogura et al. |
| 2017/0186884 | A1* | 6/2017 | Ogura .................. H01L 21/765 |
| 2018/0226398 | A1 | 8/2018 | Ogura et al. |
| 2019/0006495 | A1 | 1/2019 | Ogura et al. |
| 2019/0252533 | A1 | 8/2019 | Naito |

FOREIGN PATENT DOCUMENTS

| | | |
|---|---|---|
| JP | 2014-056942 A | 3/2014 |
| JP | 2014-063980 A | 4/2014 |
| JP | 5458595 B2 | 4/2014 |
| JP | 2014-112637 A | 6/2014 |
| JP | 2014-187320 A | 10/2014 |
| JP | 2015-177058 A | 10/2015 |
| JP | 2015-195366 A | 11/2015 |
| JP | 2016-174041 A | 9/2016 |
| JP | 6082314 B2 | 2/2017 |
| JP | 2017-055079 A | 3/2017 |
| JP | 2017-152712 A | 8/2017 |
| JP | 2019-012813 A | 1/2019 |
| JP | 2019-016804 A | 1/2019 |
| JP | 6588774 B2 | 10/2019 |
| JP | 2020-074371 A | 5/2020 |
| WO | 2018/220879 A1 | 12/2018 |

* cited by examiner

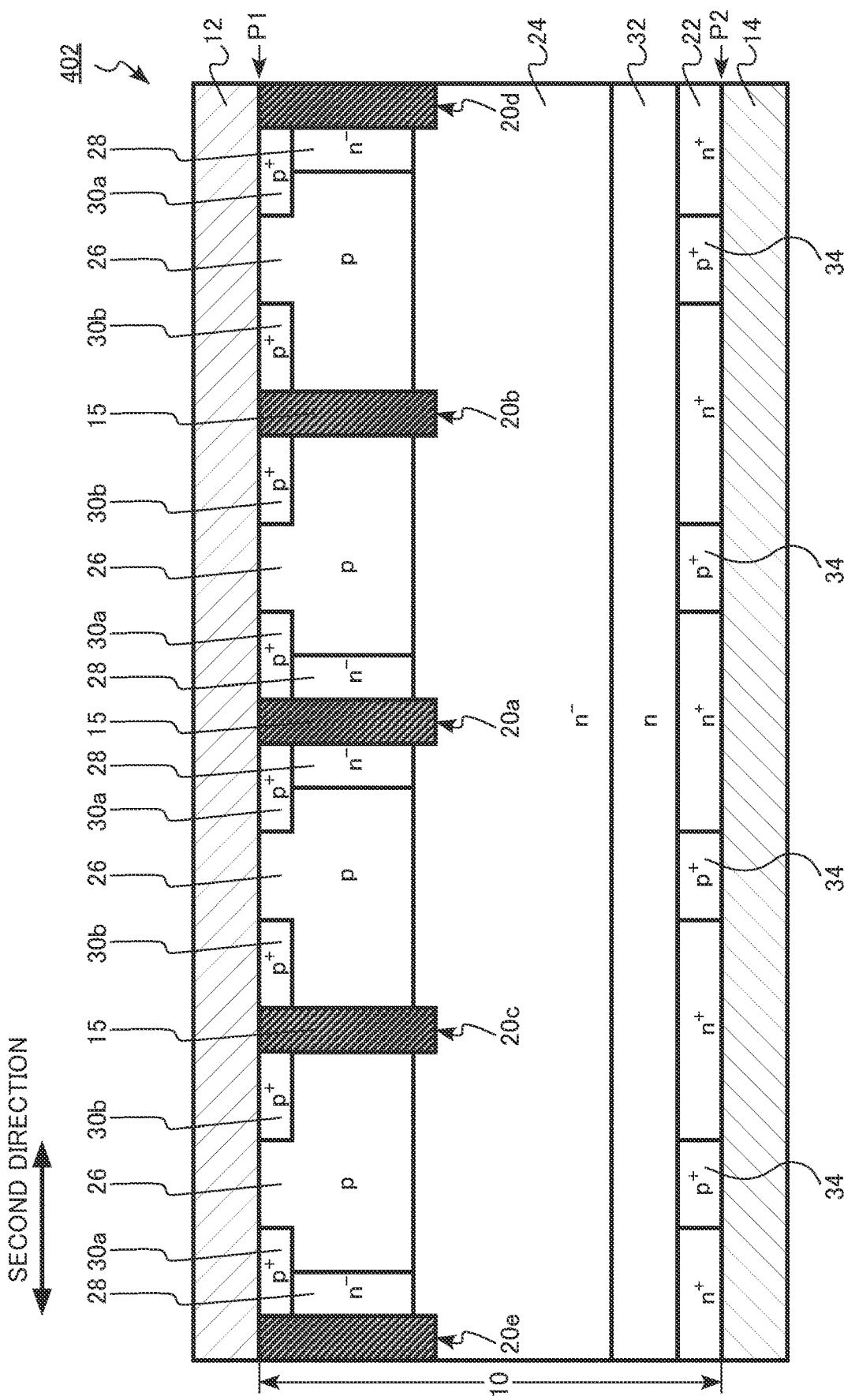

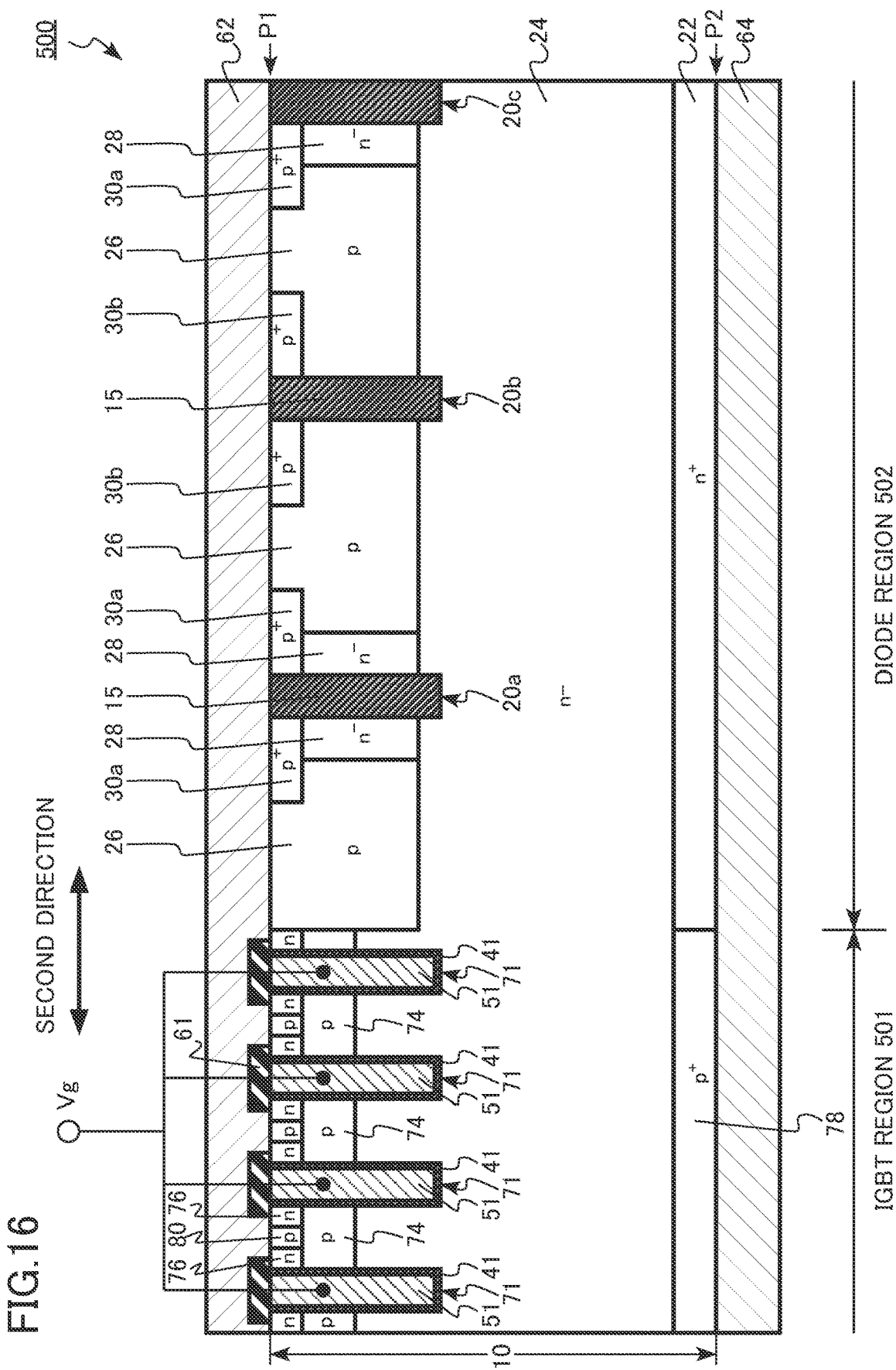

SEMICONDUCTOR DEVICE AND SEMICONDUCTOR CIRCUIT

CROSS-REFERENCE TO RELATED APPLICATION

This application is based upon and claims the benefit of priority from Japanese Patent Application No. 2021-040092, filed on Mar. 12, 2021, the entire contents of which are incorporated herein by reference.

FIELD

Embodiments described herein relate generally to a semiconductor device and a semiconductor circuit.

BACKGROUND

An example of a power semiconductor device is an insulated gate bipolar transistor (IGBT). In the IGBT, for example, a p-type collector region, an n-type drift region, and a p-type base region are provided on a collector electrode. Then, in a trench that penetrates the p-type base region and reaches the n-type drift region, a gate electrode is provided with a gate insulating film interposed therebetween. In addition, an n-type emitter region connected to an emitter electrode is provided in a region adjacent to the trench on the surface of the p-type base region.

In recent years, a reverse-conducting IGBT (RC-IGBT) in which an IGBT and a freewheeling diode are formed in the same semiconductor chip has been widely developed and commercialized. The RC-IGBT is used, for example, as a switching element in an inverter circuit. The freewheeling diode has a function of making a current flow in a direction opposite to the on-current of the IGBT. The freewheeling diode is formed, for example, by a pin (p-intrinsic-n) diode having a pn junction.

In the pin diode, a recovery loss occurs in a reverse recovery operation at which switching from the forward bias to the reverse bias occurs. In other words, the reverse recovery operation is a switching operation when the pin diode is turned off. In the reverse recovery operation, a recovery current flows in the reverse direction to discharge the carriers injected into the drift region. This current causes a recovery loss. In order to reduce the recovery loss, various structures for reducing the carriers injected into the drift region have been proposed.

In addition, in the reverse recovery operation of the pin diode, electric field concentration may occur at a specific location of the pn junction to cause avalanche breakdown. Then, when the avalanche breakdown occurs and the flowing current increases, the pin diode may be damaged. By suppressing the damage to the pin diode in the reverse recovery operation, the reverse recovery safe operating area can be expanded. The reverse recovery safe operating area is a current-voltage usable area in the reverse recovery operation.

BRIEF DESCRIPTION OF THE DRAWINGS

FIG. 15 is a schematic cross-sectional view of a second modification example of the semiconductor device of the fourth embodiment;
and
FIG. 16 is a schematic cross-sectional view of a semiconductor device of a fifth embodiment.

DETAILED DESCRIPTION

Figure 1:
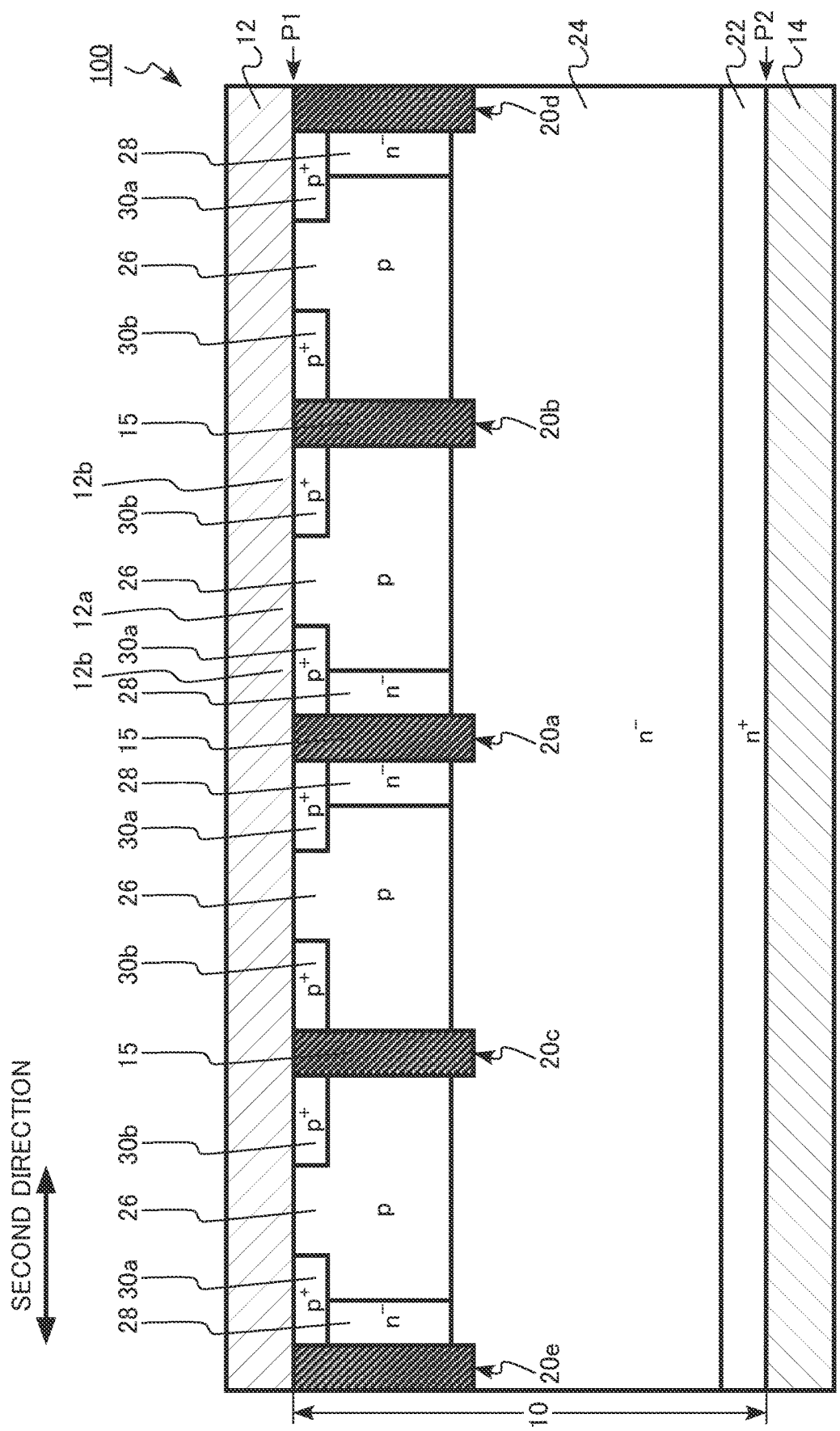
FIG. 1 is a schematic cross-sectional view of a semiconductor device of a first embodiment.

A semiconductor device of embodiments includes: a semiconductor layer having a first face and a second face opposite to the first face and including: a first trench provided in a first face side; a second trench provided in a first face side; a first semiconductor region of a first conductive type in contact with the first trench and the second trench; a second semiconductor region of a second conductive type provided between the first face and the first semiconductor region, the second semiconductor region provided between the first trench and the second trench, and the second semiconductor region being in contact with the second trench; a third semiconductor region of a first conductive type provided between the first semiconductor region and the first face, the third semiconductor region provided between the first trench and the second semiconductor region, the third semiconductor region being in contact with the first trench, and the third semiconductor region being in contact with the second semiconductor region; a fourth semiconductor region of a second conductive type provided between the third semiconductor region and the first face, the fourth semiconductor region provided between the first trench and the second semiconductor region, the fourth semiconductor region being in contact with the first trench, the fourth semiconductor region being in contact with the second semiconductor region, and the fourth semiconductor region being having a second conductive type impurity concentration higher than a second conductive type impurity concentration in the second semiconductor region; and a fifth semiconductor region of a second conductive type provided between the second semiconductor region and the first face, the fifth semiconductor region being in contact with the second trench, and the fifth semiconductor region being having a second conductive type impurity concentration higher than the second conductive type impurity concentration in the second semiconductor region, and the second semiconductor region being provided between the fourth semiconductor region and the fifth semiconductor region; a first electrode provided on the first face side of the semiconductor layer and in contact with the second semiconductor region, the fourth semiconductor region, and the fifth semiconductor region; and a second electrode provided on a second face side of the semiconductor layer.

Hereinafter, embodiments will be described with reference to the diagrams. In the following description, the same or similar members and the like are denoted by the same reference numerals, and the description of the members and the like once described will be omitted as appropriate.

In this specification, when there is a notation of n$^+$ type, n type, and n$^-$ type, this means that the impurity concentration of n type decreases in the order of n$^+$ type, n type, and n$^-$ type. In addition, when there is a notation of p$^+$ type, p type, and p$^-$ type, this means that the impurity concentration of p type decreases in the order of p$^+$ type, p type, and p$^-$ type.

In this specification, the distribution and absolute value of the impurity concentration in a semiconductor region can be measured by using, for example, secondary ion mass spectrometry (SIMS). In addition, the relative magnitude relationship between the impurity concentrations in two semiconductor regions can be determined by using, for example, scanning capacitance microscopy (SCM). In addition, the distribution and absolute value of the impurity concentration can be measured by using, for example, spreading resistance analysis (SRA). By the SCM and the SRA, the relative magnitude relationship or absolute values of the carrier concentrations in semiconductor regions can be calculated. By assuming the activation rate of impurities, the relative magnitude relationship between the impurity concentrations in two semiconductor regions, the distribution of the impurity concentration, and the absolute value of the impurity concentration can be calculated from the measurement results of the SCM and the SRA.

In addition, in this specification, the "p-type impurity concentration" in the p-type semiconductor region means the net p-type impurity concentration obtained by subtracting the n-type impurity concentration in the region from the p-type impurity concentration in the region. In addition, the "n-type impurity concentration" in the n-type semiconductor region means the net n-type impurity concentration obtained by subtracting the p-type impurity concentration in the region from the n-type impurity concentration in the region.

In addition, unless otherwise specified in this specification, the impurity concentration in a specific region means the maximum value of the impurity concentration in the region.

First Embodiment

A semiconductor device of a first embodiment includes: a semiconductor layer having a first face and a second face opposite to the first face and including: a first trench provided in a first face side; a second trench provided in a first face side; a first semiconductor region of a first conductive type in contact with the first trench and the second trench; a second semiconductor region of a second conductive type provided between the first face and the first semiconductor region, the second semiconductor region provided between the first trench and the second trench, and the second semiconductor region being in contact with the second trench; a third semiconductor region of a first conductive type provided between the first semiconductor region and the first face, the third semiconductor region provided between the first trench and the second semiconductor region, the third semiconductor region being in contact with the first trench, and the third semiconductor region being in contact with the second semiconductor region; a fourth semiconductor region of a second conductive type provided between the third semiconductor region and the first face, the fourth semiconductor region provided between the first trench and the second semiconductor region, the fourth semiconductor region being in contact with the first trench, the fourth semiconductor region being in contact with the second semiconductor region, and the fourth semiconductor region being having a second conductive type impurity concentration higher than a second conductive type impurity concentration in the second semiconductor region; and a fifth semiconductor region of a second conductive type provided between the second semiconductor region and the first face, the fifth semiconductor region being in contact with the second trench, and the fifth semiconductor region being having a second conductive type impurity concentration higher than the second conductive type impurity concentration in the second semiconductor region, and the second semiconductor region being provided between the fourth semiconductor region and the fifth semiconductor region; a first electrode provided on the first face side of the semiconductor layer and in contact with the second semiconductor region, the fourth semiconductor region, and the fifth semiconductor region; and a second electrode provided on a second face side of the semiconductor layer.

The semiconductor device of the first embodiment is a pin diode 100. The pin diode 100 is, for example, a fast recovery diode (FRD). The pin diode 100 is used, for example, as a freewheeling diode in an inverter circuit or the like. In addition, the pin diode 100 is used, for example, as a diode for the RC-IGBT.

Hereinafter, a case where the first conductive type is the n type and the second conductive type is the p type will be described as an example.

Figure 2:
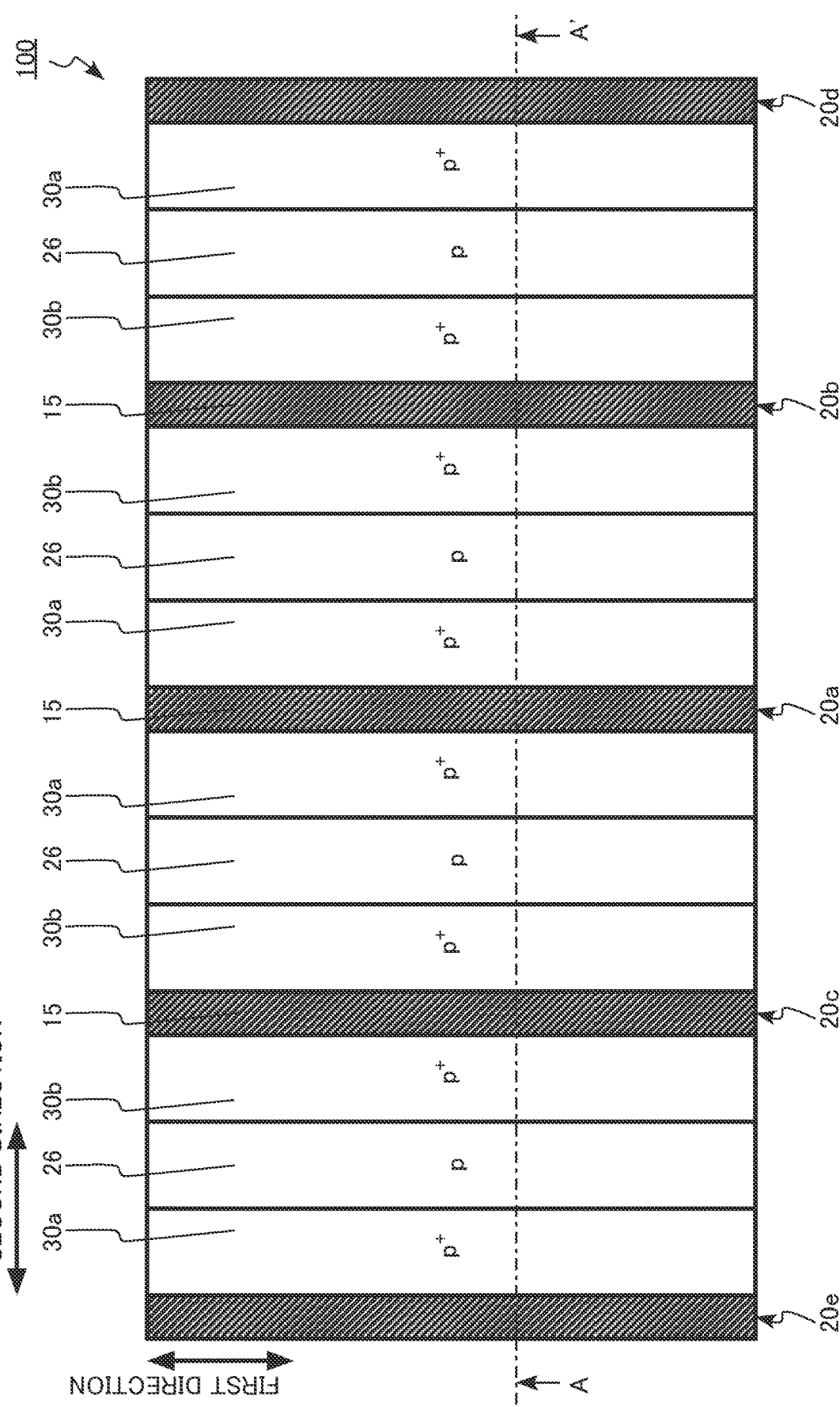
FIG. 2 is a schematic top view of the semiconductor device of the first embodiment.

FIG. 1 is a schematic cross-sectional view of the semiconductor device of the first embodiment. FIG. 2 is a schematic top view of the semiconductor device of the first embodiment. FIG. 1 is a cross-sectional view taken along the line AA' of FIG. 2. FIG. 2 is a top view of a first face P1.

The pin diode 100 of the first embodiment includes a semiconductor layer 10, an anode electrode 12 (first electrode), a cathode electrode 14 (second electrode), and a trench insulating layer 15.

In the semiconductor layer 10, a trench 20a (first trench), a trench 20b (second trench), a trench 20c, a trench 20d, a trench 20e, a cathode region 22, a drift region 24 (first semiconductor region), a base region 26 (second semiconductor region), a channel region 28 (third semiconductor region), a first anode region 30a (fourth semiconductor region), and a second anode region 30b (fifth semiconductor region) are provided.

The anode electrode 12 is an example of the first electrode. The cathode electrode 14 is an example of the second electrode. The trench 20a is an example of the first trench. The trench 20b is an example of the second trench. The drift region 24 is an example of the first semiconductor region. The base region 26 is an example of the second semiconductor region. The channel region 28 is an example of the third semiconductor region. The first anode region 30a is an example of the fourth semiconductor region. The second anode region 30b is an example of the fifth semiconductor region.

Hereinafter, the trench 20a, the trench 20b, the trench 20c, the trench 20d, and the trench 20e may be collectively referred to as a trench 20.

The semiconductor layer 10 has a first face P1 and a second face P2 opposite to the first face P1. The semiconductor layer 10 is, for example, single crystal silicon. The thickness of the semiconductor layer 10 is, for example, equal to or more than 40 µm and equal to or less than 700 µm.

In this specification, one direction parallel to the first face P1 is referred to as a first direction. In addition, a direction parallel to the first face P1 and perpendicular to the first direction is referred to as a second direction. In addition, in this specification, the "depth" is defined as a distance in a direction toward the second face P2 with the first face P1 as a reference.

The trench 20 is provided on the first face P1 side of the semiconductor layer 10. The trench 20 extends in a first direction on the first face P1. The trench 20 is repeatedly arranged in a second direction.

A plurality of trenches 20 include the trench 20a, the trench 20b, the trench 20c, the trench 20d, and the trench 20e.

The trench 20 is a groove provided in the semiconductor layer 10. The trench 20 is a part of the semiconductor layer 10. The trench 20 penetrates the base region 26 and reaches the drift region 24.

The depth of the trench 20 is larger than the depth of the base region 26. The depth of the trench 20 is, for example, equal to or more than 2 µm and equal to or less than 10 µm.

The width of the trench 20 in the second direction is, for example, equal to or more than 0.5 µm and equal to or less than 2 µm.

The distance between the adjacent trenches 20 is larger than, for example, the depth of the trench 20. For example, the distance between adjacent trenches 20a and 20b is larger than the depth of the trench 20a.

The distance between the adjacent trenches 20 is, for example, equal to or more than 5 µm and equal to or less than 30 µm. The distance between the adjacent trenches 20 is larger than, for example, 10 µm.

The trench insulating layer 15 is provided in the trench 20. The trench insulating layer 15 is, for example, silicon oxide.

The cathode region 22 is an $n^+$-type semiconductor region. The cathode region 22 is in contact with the second face P2.

The drift region 24 is an $n^-$-type semiconductor region. The drift region 24 is provided between the cathode region 22 and the first face P1. The drift region 24 is in contact with the bottom of the trench 20.

The n-type impurity concentration in the drift region 24 is lower than the n-type impurity concentration in the cathode region 22. The n-type impurity concentration in the drift region 24 is, for example, equal to or more than $1 \times 10^{12}$ atoms/cm$^3$ and equal to or less than $1 \times 10^{15}$ atoms/cm$^3$.

The base region 26 is a p-type semiconductor region. The base region 26 is provided between the drift region 24 and the first face P1. The base region 26 is in contact with, for example, the drift region 24. The base region 26 extends in the first direction on the first face P1.

The base region 26 is provided between two adjacent trenches 20. The base region 26 is provided, for example, between the trench 20a and the trench 20b. The base region 26 is provided, for example, between the trench 20a and the trench 20c.

The base region 26 is in contact with the side surfaces of at least some of the trenches 20. The base region 26 is in contact with, for example, the side surface of the trench 20b. The base region 26 is in contact with, for example, the side surface of the trench 20c.

The base region 26 is spaced from at least some of the trenches 20. The base region 26 is spaced from, for example, the trench 20a.

The p-type impurity concentration in the base region 26 is, for example, equal to or more than $1 \times 10^{16}$ atoms/cm$^3$ and equal to or less than $5 \times 10^{17}$ atoms/cm$^3$.

The depth of the base region 26 is smaller than the depth of the trench 20. The depth of the base region 26 is larger than, for example, half the depth of the trench. The depth of the base region 26 is, for example, equal to or more than 2 µm and equal to or less than 8 µm.

The channel region 28 is an $n^-$-type semiconductor region. The channel region 28 is provided between the drift region 24 and the first face P1.

The channel region 28 is provided between some of the trenches 20 and the base region 26. The channel region 28 is provided, for example, between the trench 20a and the base region 26. The channel region 28 is provided, for example, between the trench 20d and the base region 26. The channel region 28 is provided, for example, between the trench 20e and the base region 26.

The channel region 28 is in contact with the side surfaces of some of the trenches 20. The channel region 28 is in contact with, for example, the side surface of the trench 20a. The channel region 28 is in contact with, for example, the side surface of the trench 20d. The channel region 28 is in contact with, for example, the side surface of the trench 20e.

The channel region 28 is in contact with the base region 26.

The n-type impurity concentration in the channel region 28 is higher than, for example, the n-type impurity concentration in the drift region 24. The n-type impurity concentration in the channel region 28 is, for example, equal to or more than $1 \times 10^{12}$ atoms/cm$^3$ and equal to or less than $1 \times 10^{16}$ atoms/cm$^3$.

The first anode region 30a is a p-type semiconductor region. The first anode region 30a is provided between the channel region 28 and the first face P1. The first anode region 30a extends in the first direction on the first face P1.

The first anode region 30a is in contact with the side surfaces of some of the trenches 20. The first anode region 30a is in contact with, for example, the side surface of the trench 20a. The first anode region 30a is in contact with, for example, the side surface of the trench 20d. The first anode region 30a is in contact with, for example, the side surface of the trench 20e.

The first anode region 30a is in contact with the base region 26.

The p-type impurity concentration in the first anode region 30a is higher than the p-type impurity concentration in the base region 26. The p-type impurity concentration in the first anode region 30a is, for example, equal to or more than $1 \times 10^{17}$ atoms/cm$^3$ and equal to or less than $1 \times 10^{21}$ atoms/cm$^3$.

The depth of the first anode region 30a is smaller than the depth of the base region 26. The depth of the first anode region 30a is, for example, equal to or more than 0.1 µm and equal to or less than 2 µm.

The width of the first anode region 30a in the second direction is larger than the width of the channel region 28 in the second direction.

The second anode region 30b is a p-type semiconductor region. The second anode region 30b is provided between the base region 26 and the first face P1. The second anode region 30b extends in the first direction on the first face P1.

The base region 26 is provided between the second anode region 30b and the first anode region 30a. The second anode region 30b is in contact with the base region 26.

The second anode region 30b is in contact with the side surfaces of some of the trenches 20. The second anode region 30b is in contact with, for example, the side surface of the trench 20b. The second anode region 30b is in contact with, for example, the side surface of the trench 20c.

The p-type impurity concentration in the second anode region 30b is higher than the p-type impurity concentration in the base region 26. The p-type impurity concentration in the second anode region 30b is, for example, equal to or more than $1 \times 10^{17}$ atoms/cm$^3$ and equal to or less than $1 \times 10^{21}$ atoms/cm$^3$.

The depth of the second anode region 30b is smaller than the depth of the base region 26. The depth of the second anode region 30b is, for example, equal to or more than 0.1 μm and equal to or less than 2 μm.

There is no channel region 28 between the second anode region 30b and the drift region 24. There is no n-type semiconductor region between the second anode region 30b and the drift region 24.

The anode electrode 12 is provided on the first face P1 side of the semiconductor layer 10. The anode electrode 12 is in contact with the first face P1 of the semiconductor layer 10.

The anode electrode 12 includes a first portion 12a and a second portion 12b. The anode electrode 12 is in contact with the base region 26, for example, at the first portion 12a. The anode electrode 12 is in contact with the first anode region 30a and the second anode region 30b, for example, at the second portion 12b.

The anode electrode 12 makes Schottky contact with the base region 26, for example, at the first portion 12a. The anode electrode 12 makes ohmic contact with the first anode region 30a and the second anode region 30b, for example, at the second portion 12b.

The anode electrode 12 is, for example, a metal. For example, the material of the first portion 12a may be different from the material of the second portion 12b.

The cathode electrode 14 is provided on the second face P2 side of the semiconductor layer 10. The cathode electrode 14 is in contact with the second face P2 of the semiconductor layer 10. The cathode electrode 14 is in contact with the cathode region 22. The cathode electrode 14 makes ohmic contact with the cathode region 22.

The cathode electrode 14 is, for example, a metal.

Next, the function and effect of the pin diode 100 of the first embodiment will be described.

Figure 3:
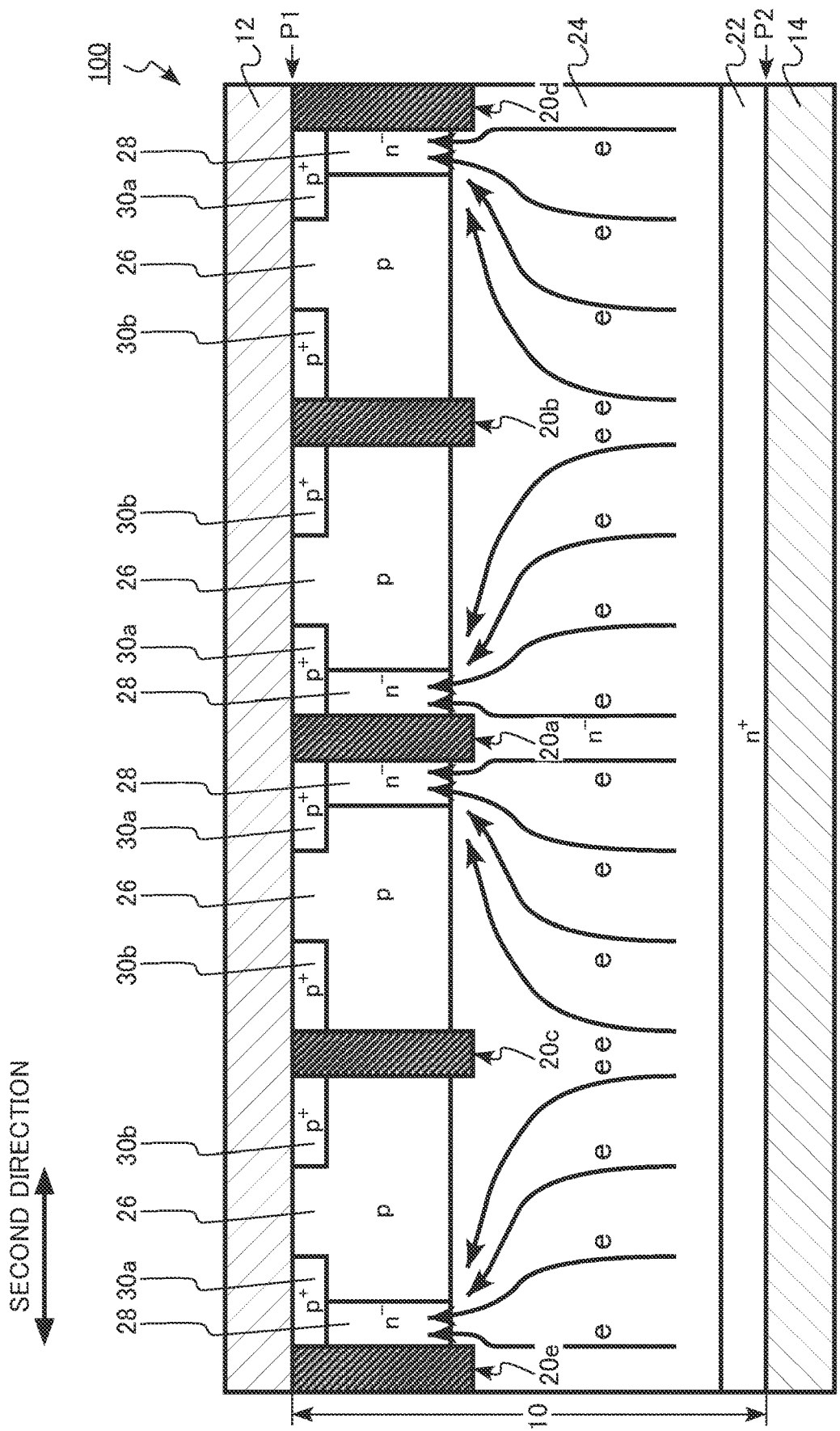
FIG. 3 is an explanatory diagram of the function and effect of the semiconductor device of the first embodiment.
Figure 4:
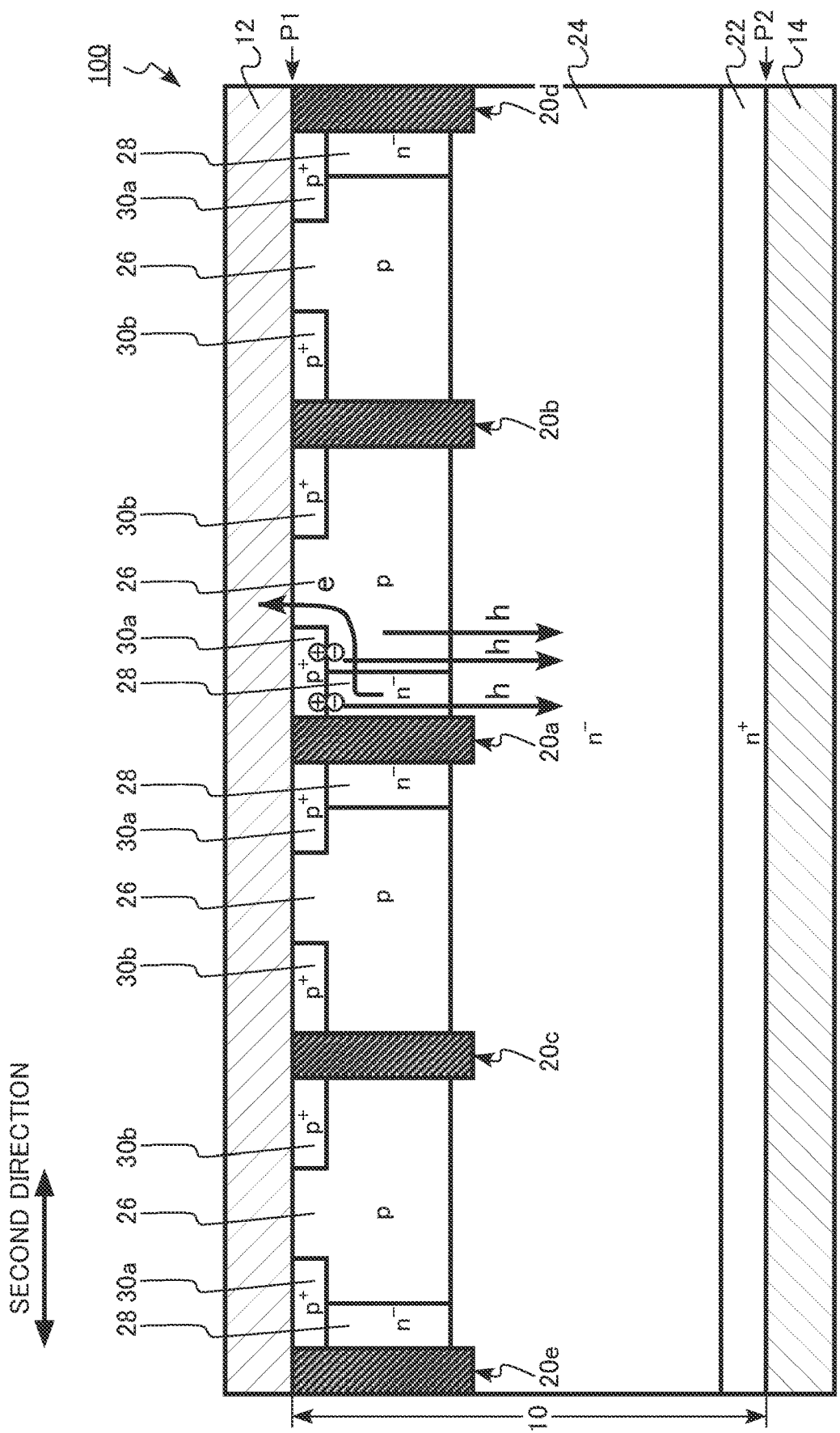
FIG. 4 is an explanatory diagram of the function and effect of the semiconductor device of the first embodiment.

FIGS. 3 and 4 are explanatory diagrams of the function and effect of the semiconductor device of the first embodiment. FIG. 3 shows the flow of electrons (electron current) when the pin diode 100 is ON. FIG. 4 shows the flow of holes (hole current) when the pin diode 100 is ON.

When the pin diode 100 is ON, a forward bias is applied between the anode electrode 12 and the cathode electrode 14. That is, a voltage is applied between the anode electrode 12 and the cathode electrode 14 so that the electric potential of the anode electrode 12 is higher than the electric potential of the cathode electrode 14. That is, a voltage is applied between the anode electrode 12 and the cathode electrode 14 so that the side of the anode electrode 12 becomes positive. The anode electrode 12 serves as a positive electrode, and the cathode electrode 14 serves as a negative electrode.

First, the flow of electrons when the pin diode 100 is ON will be described. The cathode electrode 14 makes ohmic contact with the cathode region 22. Therefore, electrons ("e" in FIG. 3) injected from the cathode electrode 14 reach immediately below the p-type base region 26 from the n$^+$-type cathode region 22 through the n$^-$-type drift region 24.

The pin diode 100 has an n$^-$-type channel region 28 on the side surfaces of some of the trenches 20. Therefore, the electrons that have reached immediately below the base region 26 bypass the energy barrier between the drift region 24 and the base region 26 and flow to the channel region 28 having a low potential. The electrons flow immediately below the first anode region 30a of p$^+$-type.

The electrons that have reached immediately below the first anode region 30a bypass the energy barrier between the first anode region 30a and the channel region 28 and flow to the base region 26 having a low potential. The electrons flow immediately below the anode electrode 12.

The base region 26 makes Schottky contact with the anode electrode 12. That is, the contact between the base region 26 and the anode electrode 12 is a Schottky contact between the p-type semiconductor and the metal. Therefore, the contact between the base region 26 and the anode electrode 12 serves as an energy barrier for holes but not for electrons. Therefore, electrons flow from the base region 26 to the anode electrode 12.

As described above, when the pin diode 100 is ON, electrons flow from the cathode electrode 14 to the anode electrode 12 through the n$^+$-type cathode region 22, the n$^-$-type drift region 24, the n$^-$-type channel region 28, and the p-type base region 26. The electron current flows from the cathode electrode 14 to the anode electrode 12.

Next, the flow of holes (hole current) when the pin diode 100 is ON will be described.

As described above, in the ON state, the electrons that have reached immediately below the first anode region 30a bypass the energy barrier between the first anode region 30a and the channel region 28 and flow to the base region 26 having a low potential. As shown in FIG. 4, the electrons move laterally below the first anode region 30a and flow to the base region 26.

This lateral movement of the electrons causes a voltage drop below the first anode region 30a. Due to the voltage drop that occurs in the first anode region 30a, as shown in FIG. 4, the first anode region 30a and the channel region 28 immediately below the first anode region 30a are in a forward bias state. In addition, the first anode region 30a and the base region 26 immediately below the first anode region 30a are in a forward bias state.

Since the first anode region 30a and the channel region 28 immediately below the first anode region 30a are in a forward bias state, holes ("h" in FIG. 4) are injected from the first anode region 30a to the channel region 28. In addition, since the first anode region 30a and the base region 26 immediately below the first anode region 30a are in a forward bias state, holes ("h" in FIG. 4) are injected from the first anode region 30a to the base region 26.

The injected holes flow to the cathode electrode 14 through the drift region 24 and the cathode region 22. The hole current flows from the anode electrode 12 to the cathode electrode 14.

The hole current increases as the width or depth of the first anode region 30a in the second direction increases. In addition, the hole current increases as the contact area between the first anode region 30a and the anode electrode 12 increases. In other words, the amount of holes injected from the anode electrode 12 can be adjusted by adjusting the width or depth of the first anode region 30a in the second direction or the contact area between the first anode region 30a and the anode electrode 12.

When the pin diode 100 is ON, electrons flow to the anode electrode 12 through the channel region 28. It is difficult for electrons to flow directly from the drift region 24 immediately below the base region 26 to the anode electrode 12 through the base region 26.

Some of the electrons are injected from the drift region 24 into the base region 26 without passing through the channel region 28. This electron injection causes hole injection from the base region 26 into the drift region 24.

However, by allowing most of the electrons to flow from the drift region 24 to the anode electrode 12 through the channel region 28, hole injection into the drift region 24 is suppressed.

In the pin diode, a recovery loss occurs in a reverse recovery operation at which switching from the forward bias to the reverse bias occurs. In the reverse recovery operation, a recovery current flows in the reverse direction because the carriers injected into the drift region are discharged. This current causes a recovery loss. The recovery loss can be reduced by reducing the carriers injected into the drift region.

According to the pin diode 100 of the first embodiment, the carriers injected into the drift region 24 can be reduced by providing the channel region 28. Therefore, according to the pin diode 100 of the first embodiment, the recovery loss can be reduced.

Figure 5:
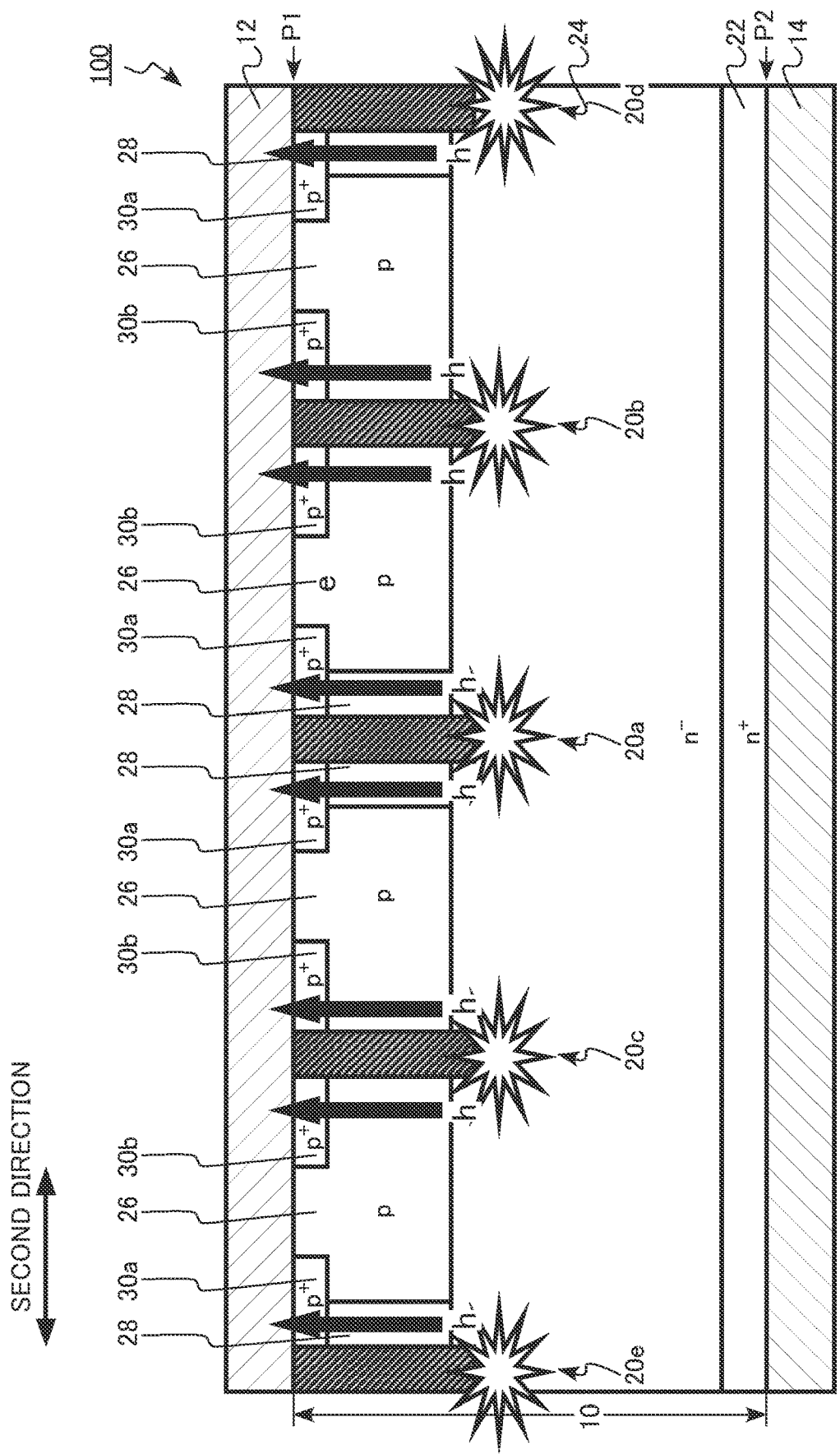
FIG. 5 is an explanatory diagram of the function and effect of the semiconductor device of the first embodiment.

FIG. 5 is an explanatory diagram of the function and effect of the semiconductor device of the first embodiment. FIG. 5 is an explanatory diagram of the reverse recovery operation of the pin diode 100.

During the reverse recovery operation of the pin diode 100, that is, when the pin diode 100 is turned off, the pin diode 100 switches from ON to OFF. The voltage applied between the anode electrode 12 and the cathode electrode 14 changes from the forward bias to the reverse bias.

When the pin diode 100 is turned off, the voltage between the anode electrode 12 and the cathode electrode 14 is changed so that the electric potential of the anode electrode 12 is lower than the electric potential of the cathode electrode 14. That is, when the pin diode 100 is turned off, a voltage is applied between the anode electrode 12 and the cathode electrode 14 so that the side of the cathode electrode 14 becomes positive. The anode electrode 12 serves as a negative electrode, and the cathode electrode 14 serves as a positive electrode.

In the reverse recovery operation of the pin diode, electric field concentration may occur at a specific location of the pn junction, and accordingly, avalanche breakdown may occur. Then, when the avalanche breakdown occurs and the flowing current becomes large, the pin diode may be damaged. By suppressing the damage to the pin diode in the reverse recovery operation, the reverse recovery safe operating area can be expanded. The reverse recovery safe operating area is a current-voltage usable area in the reverse recovery operation.

In the pin diode 100, electric field concentration is likely to occur at the bottom of the trench 20 at the time of turn-off. Therefore, as shown in FIG. 5, avalanche breakdown is likely to occur at the bottom of the trench 20 at the time of turn-off.

Due to the avalanche breakdown that occurs at the bottom of the trench 20, a large amount of carriers are generated. The flow of the generated carriers is referred to as an avalanche current. If the avalanche current increases, the pin diode may be damaged. For example, when the avalanche current is concentrated at a specific location, the temperature rises and the pin diode is damaged.

In the pin diode 100, the first anode region 30a of $p^+$-type or the second anode region 30b of $p^+$-type are provided on both sides of the trench 20. The holes generated by the avalanche breakdown at the bottom of the trench 20 are discharged to the anode electrode 12 at the shortest distance from the bottom of the trench 20 through the first anode region 30a or the second anode region 30b.

In the pin diode 100, the trenches 20 are provided in the semiconductor layer 10 at a predetermined ratio. For this reason, at the time of turn-off, the avalanche breakdown occurs at dispersed places. In addition, on both sides of each trench 20, the first anode region 30a of $p^+$-type or the second anode region 30b of $p^+$-type serving as a hole discharge path is provided. For this reason, the hole discharge path is also dispersed.

Therefore, in the pin diode 100, the avalanche current is unlikely to be concentrated at a specific location. Therefore, according to the pin diode 100, the damage in the reverse recovery operation is suppressed, so that the reverse recovery safe operating area can be expanded.

From the viewpoint of reducing the recovery loss of the pin diode 100, it is conceivable to reduce the occupancy ratio of the channel region 28 in the semiconductor layer 10. In the pin diode 100, the first anode region 30a or the second anode region 30b is provided on both sides of the trench 20 regardless of the presence or absence of the channel region 28 in contact with the trench 20. Therefore, from the viewpoint of reducing the recovery loss, even if the occupancy ratio of the channel region 28 in the semiconductor layer 10 is reduced, the damage in the reverse recovery operation can be suppressed.

From the viewpoint of reducing the occupancy ratio of the channel region 28 in the semiconductor layer 10 and reducing the recovery loss of the pin diode 100, it is preferable that the distance between the adjacent trenches 20 is large.

From the above viewpoint, it is preferable that the distance between the adjacent trenches 20 is larger than, for example, the depth of the trench 20. For example, the distance between the adjacent trenches 20 is preferably equal to or more than 1.5 times the depth of the trench 20, more preferably equal to or more than 2 times the depth of the trench 20.

From the above viewpoint, for example, the distance between the adjacent trenches 20 is preferably larger than 10 μm, more preferably equal to or more than 12 μm, and even more preferably equal to or more than 15 μm.

When the difference between the depth of the trench 20 and the depth of the base region 26 increases, the electric field strength at the bottom of the trench 20 increases when the pin diode 100 is turned off. Therefore, the breakdown voltage of the pin diode 100 may decrease.

From the above viewpoint, the depth of the base region 26 is preferably equal to or more than half the depth of the trench 20, more preferably equal to or more than three-quarters of the depth of the trench 20, and even more preferably equal to or more than nine-tenths of the depth of the trench 20.

It is preferable that the n-type impurity concentration in the channel region 28 is higher than the n-type impurity concentration in the drift region 24. By making the n-type impurity concentration in the channel region 28 higher than the n-type impurity concentration in the drift region 24, electrons can easily flow from the drift region 24 to the channel region 28.

In the pin diode 100, it is preferable that the material of the first portion 12a of the anode electrode 12 is different from the material of the second portion 12b. It can be easily realized to make the contact between the first portion 12a and the base region 26 as Schottky contact and the contact between the second portion 12b and each of the first anode region 30a and the second anode region 30b as ohmic contact.

Figure 6:
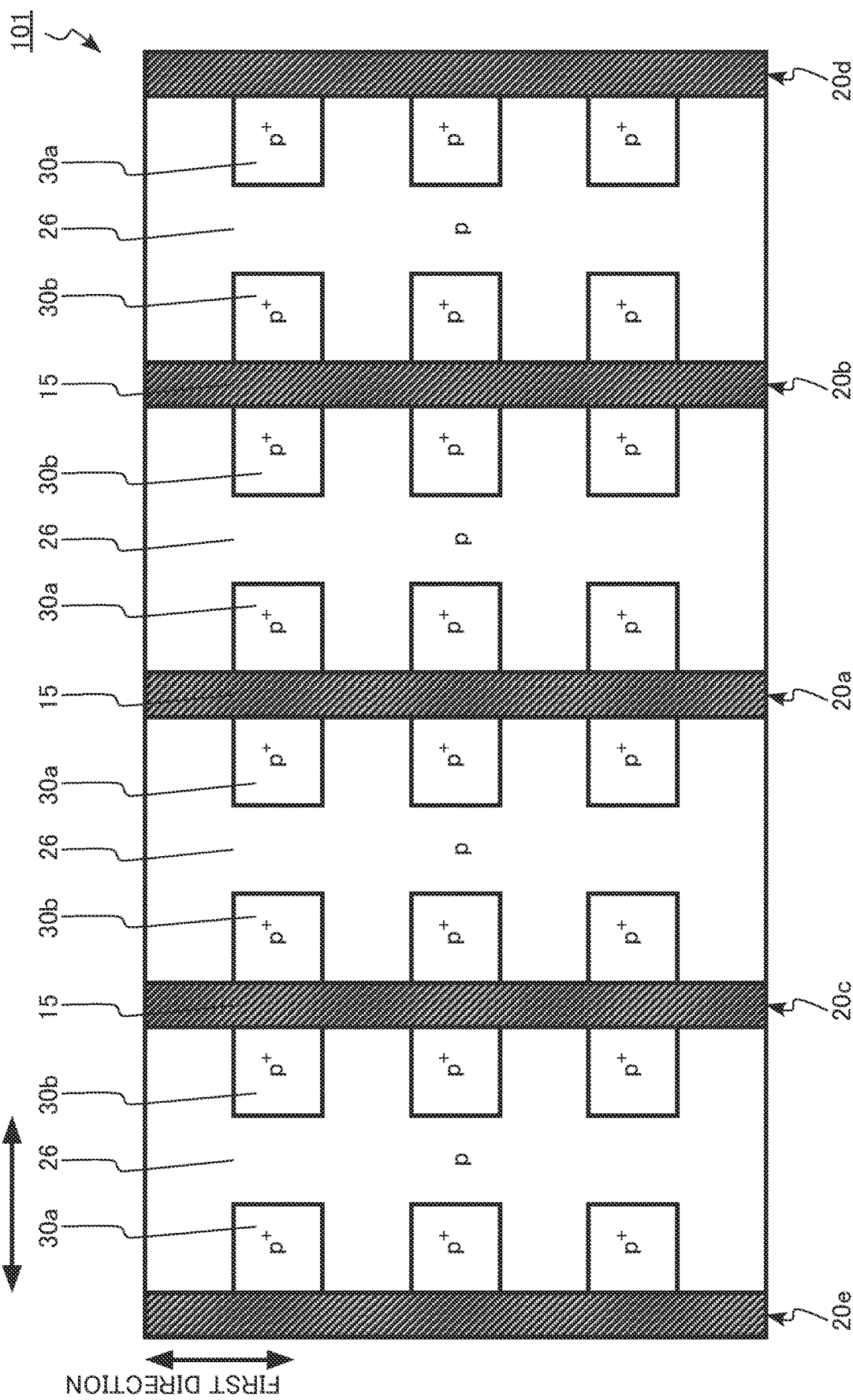
FIG. 6 is a schematic top view of a modification example of the semiconductor device of the first embodiment.

FIG. 6 is a schematic top view of a modification example of the semiconductor device of the first embodiment. The modification example of the semiconductor device of the first embodiment is a pin diode 101.

The pin diode 101 is different from the pin diode 101 of the first embodiment in that the first anode region 30a and the second anode region 30b are arranged so as to be divided into a plurality of parts in the first direction. In addition, although not shown in FIG. 6, the channel region 28 below the first anode region 30a is also arranged so as to be divided into a plurality of parts in the first direction.

As described above, according to the first embodiment and its modification example, it is possible to provide a pin diode having a reduced recovery loss and an expanded safe operating area.

Second Embodiment

A semiconductor device of a second embodiment is different from the semiconductor device of the first embodiment in that the fifth semiconductor region in contact with the first trench is provided with the first trench interposed between the fourth semiconductor region and the fifth semiconductor region. Hereinafter, the description of the content overlapping the first embodiment will be omitted.

The semiconductor device of the second embodiment is a pin diode 200.

Figure 7:
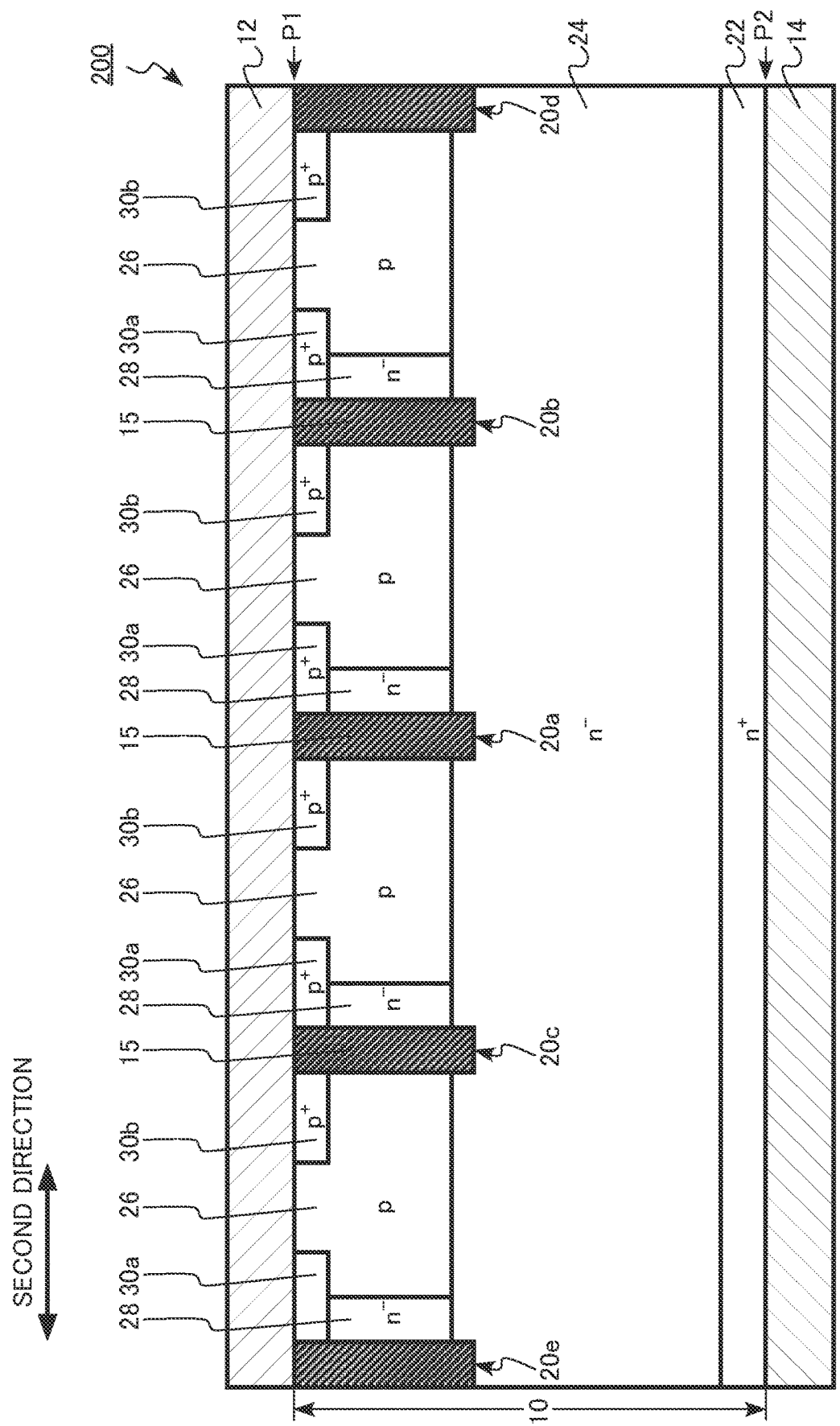
FIG. 7 is a schematic cross-sectional view of a semiconductor device of a second embodiment.

FIG. 7 is a schematic cross-sectional view of the semiconductor device of the second embodiment.

The pin diode 200 of the second embodiment includes a semiconductor layer 10, an anode electrode 12 (first electrode), a cathode electrode 14 (second electrode), and a trench insulating layer 15.

In the semiconductor layer 10, a trench 20a (first trench), a trench 20b (second trench), a trench 20c, a trench 20d, a trench 20e, a cathode region 22, a drift region 24 (first semiconductor region), a base region 26 (second semiconductor region), a channel region 28 (third semiconductor region), a first anode region 30a (fourth semiconductor region), and a second anode region 30b (fifth semiconductor region) are provided.

The anode electrode 12 is an example of the first electrode. The cathode electrode 14 is an example of the second electrode. The trench 20a is an example of the first trench. The trench 20b is an example of the second trench. The drift region 24 is an example of the first semiconductor region. The base region 26 is an example of the second semiconductor region. The channel region 28 is an example of the third semiconductor region. The first anode region 30a is an example of the fourth semiconductor region. The second anode region 30b is an example of the fifth semiconductor region.

Hereinafter, the trench 20a, the trench 20b, the trench 20c, the trench 20d, and the trench 20e may be collectively referred to as a trench 20.

In the pin diode 200, the first anode region 30a and the second anode region 30b are provided with the trench 20 interposed therebetween. In other words, the trench 20 is provided between the first anode region 30a and the second anode region 30b. The first anode region 30a is in contact with one side surface of the same trench 20, and the second anode region 30b is in contact with the other side surface.

For example, the first anode region 30a and the second anode region 30b are provided with the trench 20a interposed therebetween. For example, the trench 20a is provided between the first anode region 30a and the second anode region 30b. For example, the first anode region 30a is in contact with one side surface of the trench 20a, and the second anode region 30b is in contact with the other side surface.

According to the pin diode 200 of the second embodiment, the bias of the distribution of the channel region 28 in the semiconductor layer 10 is smaller than that in the pin diode 100 of the first embodiment. Therefore, the hole injection into the drift region 24 becomes more uniform. As a result, the current flow of the pin diode 200 becomes more uniform.

As described above, according to the second embodiment, it is possible to provide a pin diode having a reduced recovery loss and an expanded safe operating area.

Third Embodiment

A semiconductor device of a third embodiment is different from the semiconductor device of the first embodiment in that a third electrode provided in the first trench and the second trench and electrically separated from the first electrode and the second electrode is further provided. Hereinafter, the description of the content overlapping the first embodiment will be omitted.

A semiconductor circuit of the third embodiment includes: the semiconductor device described above; and a control circuit for driving the semiconductor device and for applying a voltage negative with respect to the first electrode to the third electrode with a voltage making a side of the second electrode positive being applied between the first electrode and the second electrode when the first conductive type is an n type and applying a voltage positive with respect to the first electrode to the third electrode with a voltage making the side of the second electrode negative being applied between the first electrode and the second electrode when the first conductive type is a p type.

The semiconductor device of the third embodiment is a pin diode 300.

A control circuit of the third embodiment is a gate driver circuit 350. A semiconductor circuit of the third embodiment includes a semiconductor device and a control circuit for controlling the semiconductor device.

Hereinafter, a case where the first conductive type is the n type and the second conductive type is the p type will be described as an example.

Figure 8:
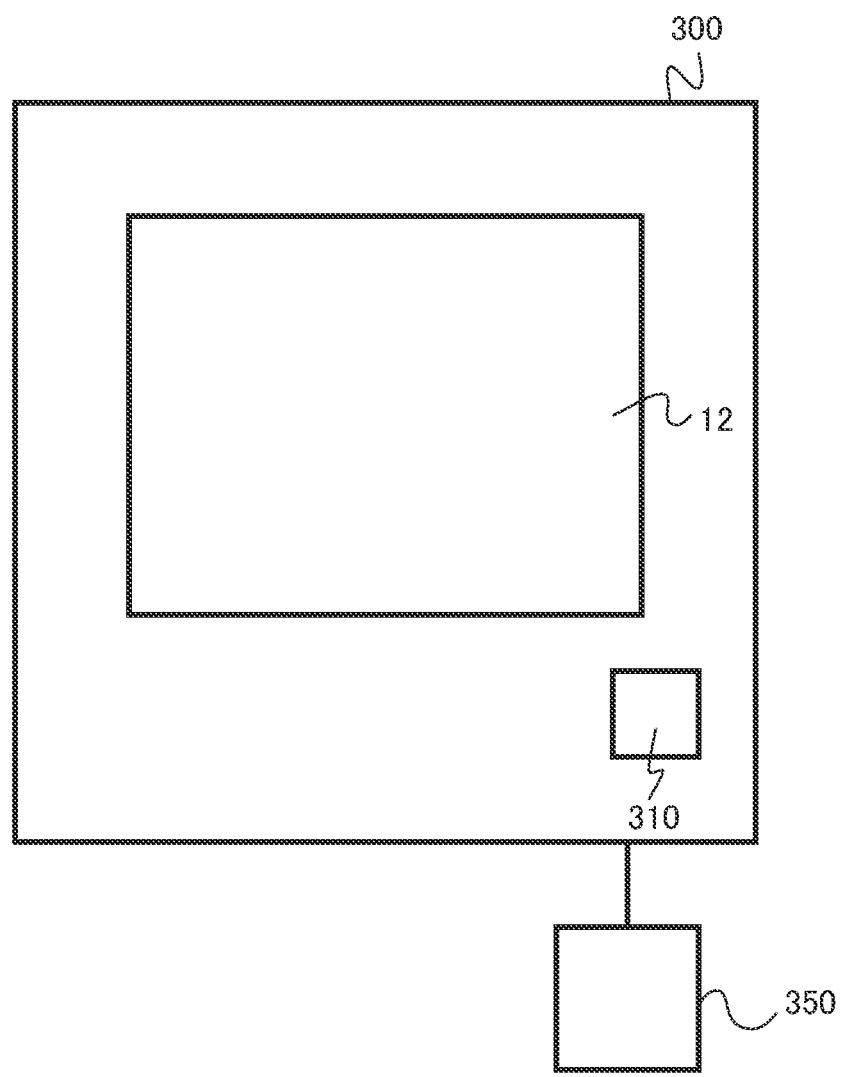
FIG. 8 is a schematic diagram of a semiconductor circuit of a third embodiment.

FIG. 8 is a schematic diagram of the semiconductor circuit of the third embodiment. The semiconductor circuit of the third embodiment includes the pin diode 300 and the gate driver circuit 350. The gate driver circuit 350 controls the pin diode 300.

Figure 9:
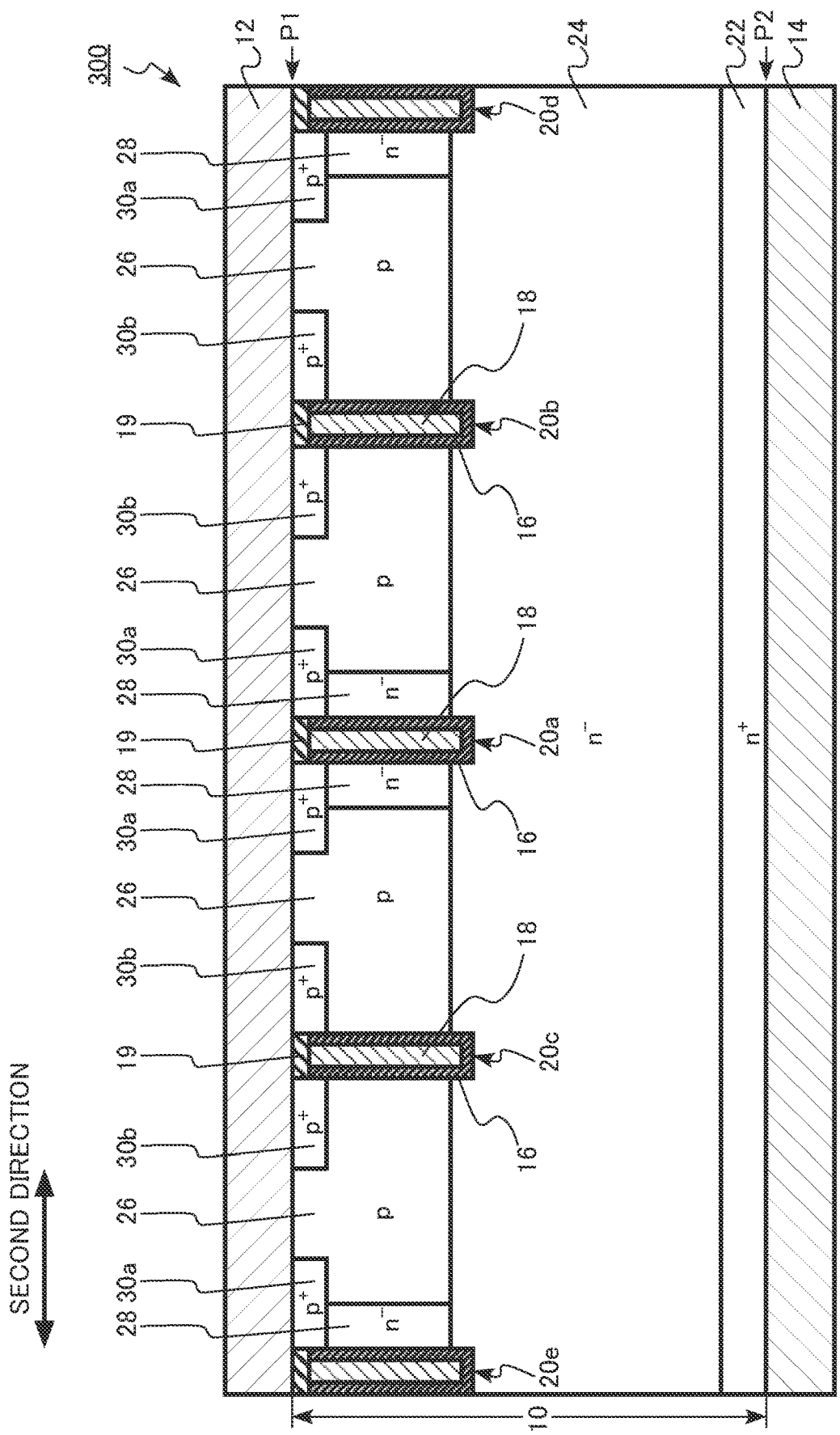
FIG. 9 is a schematic cross-sectional view of a semiconductor device of the third embodiment.

FIG. 9 is a schematic cross-sectional view of the semiconductor device of the third embodiment.

The pin diode 300 of the third embodiment includes a semiconductor layer 10, an anode electrode 12 (first electrode), a cathode electrode 14 (second electrode), a trench gate insulating film 16, a trench gate electrode 18 (third electrode), an interlayer insulating layer 19, and an electrode pad 310.

In the semiconductor layer 10, a trench 20a (first trench), a trench 20b (second trench), a trench 20c, a trench 20d, a trench 20e, a cathode region 22, a drift region 24 (first semiconductor region), a base region 26 (second semiconductor region), a channel region 28 (third semiconductor region), a first anode region 30a (fourth semiconductor region), and a second anode region 30b (fifth semiconductor region) are provided.

The anode electrode 12 is an example of the first electrode. The cathode electrode 14 is an example of the second electrode. The trench gate electrode 18 is an example of the third electrode. The trench 20a is an example of the first trench. The trench 20b is an example of the second trench. The drift region 24 is an example of the first semiconductor region. The base region 26 is an example of the second semiconductor region. The channel region 28 is an example of the third semiconductor region. The first anode region 30a is an example of the fourth semiconductor region. The second anode region 30b is an example of the fifth semiconductor region.

Hereinafter, the trench 20a, the trench 20b, the trench 20c, the trench 20d, and the trench 20e may be collectively referred to as a trench 20.

The trench gate electrode 18 is provided in the trench 20. The trench gate electrode 18 is provided, for example, in the trench 20a. The trench gate electrode 18 is provided, for example, in the trench 20b. The trench gate electrode 18 is provided, for example, in the trench 20c.

The trench gate electrode 18 is, for example, a semiconductor or a metal. The trench gate electrode 18 is, for example, amorphous silicon or polycrystalline silicon containing n-type impurities or p-type impurities.

The trench gate electrode 18 is electrically separated from the anode electrode 12 and the cathode electrode 14. The trench gate electrode 18 is electrically connected to the electrode pad 310.

The trench gate insulating film 16 is provided between the trench gate electrode 18 and the semiconductor layer 10. The trench gate insulating film 16 is, for example, silicon oxide.

The interlayer insulating layer 19 is provided between the trench gate electrode 18 and the anode electrode 12. The interlayer insulating layer 19 electrically separates the trench gate electrode 18 from the anode electrode 12. The interlayer insulating layer 19 is, for example, silicon oxide.

The electrode pad 310 is provided on the first face P1 side of the semiconductor layer 10. The electrode pad 310 is electrically connected to the trench gate electrode 18. The electrode pad 310 and the trench gate electrode 18 are connected to each other by, for example, a metal wiring (not shown).

Next, the function and effect of the semiconductor device and the semiconductor circuit of the third embodiment will be described.

Figure 10:
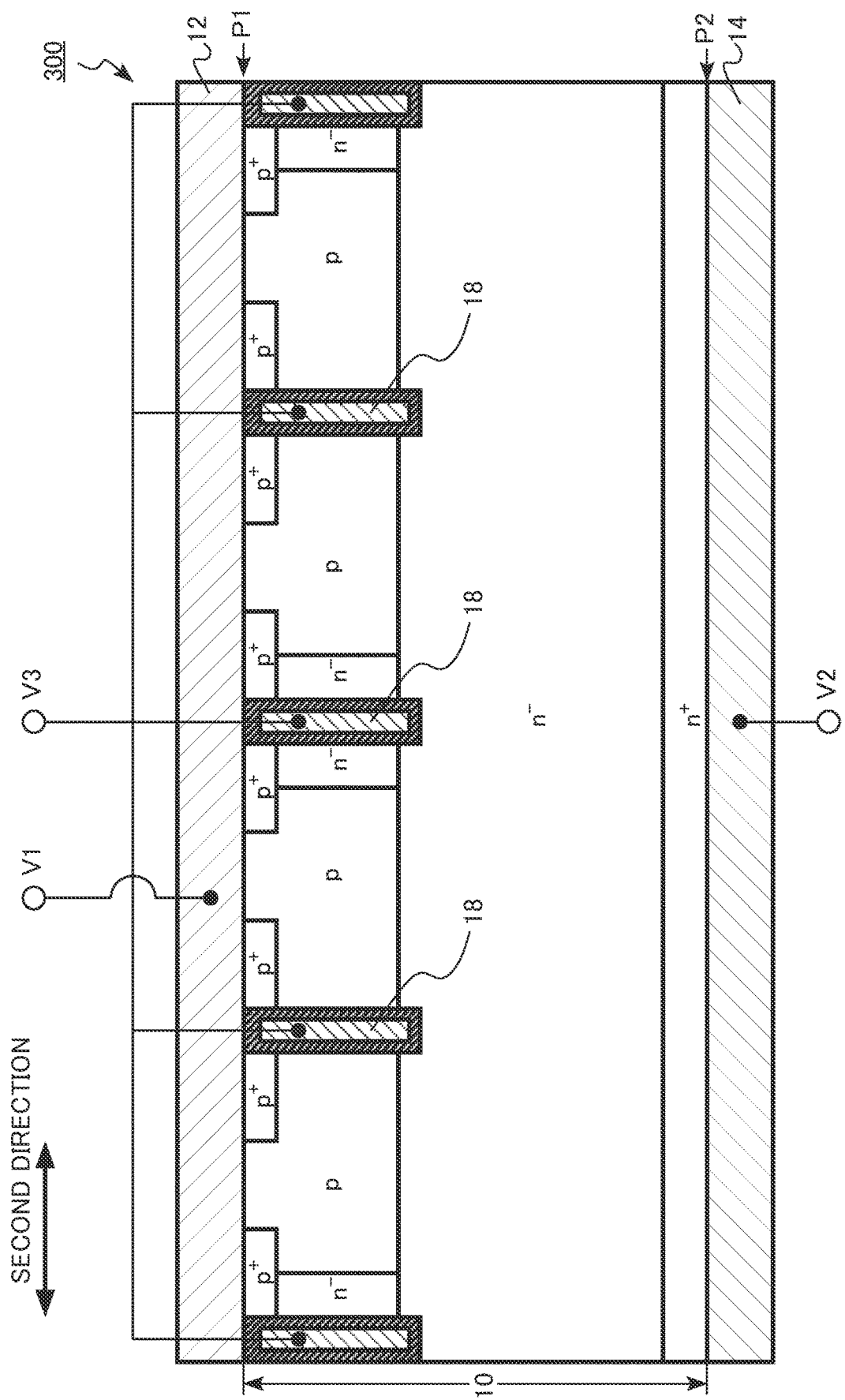
FIG. 10 is an explanatory diagram of the function and effect of the semiconductor device and the semiconductor circuit of the third embodiment.
Figure 11:
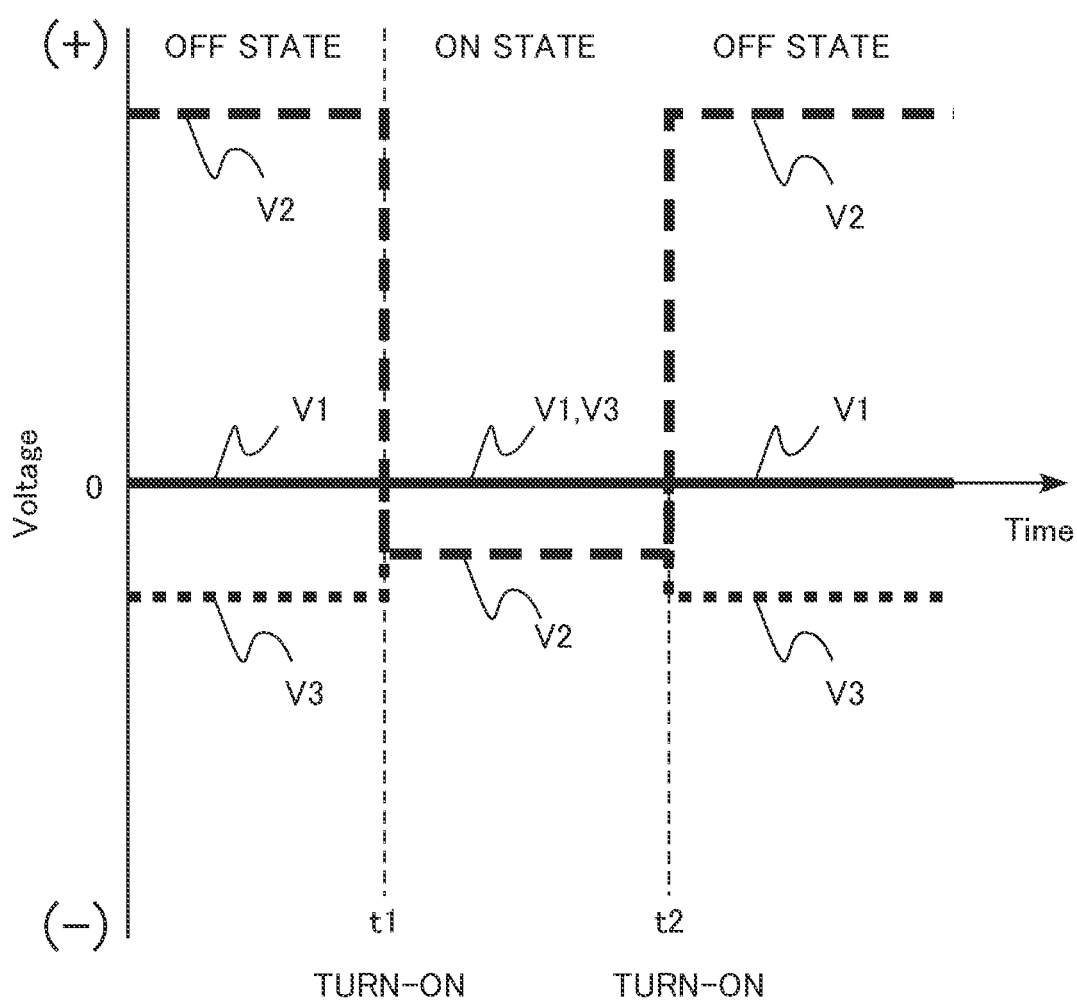
FIG. 11 is an explanatory diagram of the function and effect of the semiconductor device and the semiconductor circuit of the third embodiment.
Figure 12:
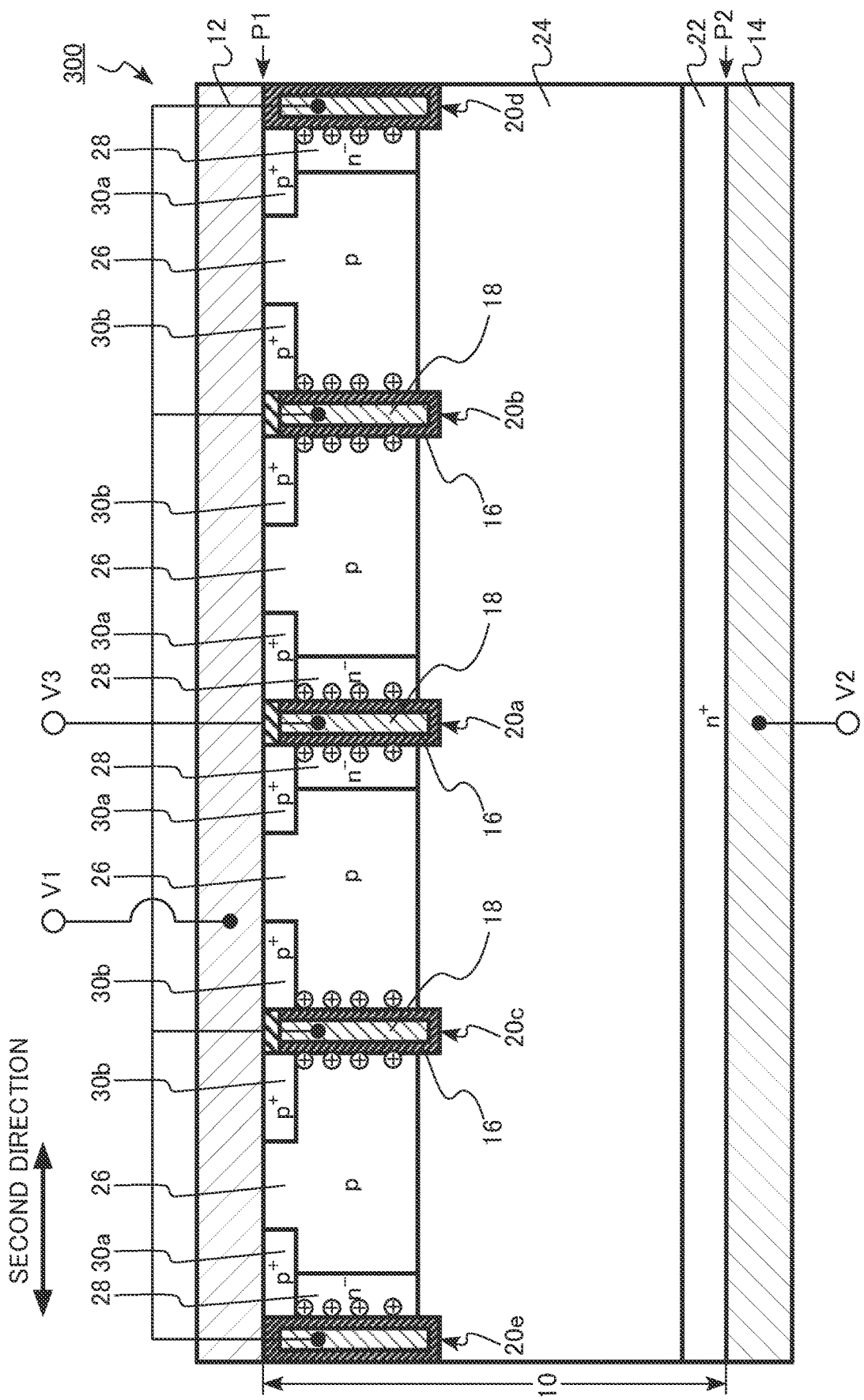
FIG. 12 is an explanatory diagram of the function and effect of the semiconductor device and the semiconductor circuit of the third embodiment.

FIGS. 10, 11, and 12 are explanatory diagrams of the function and effect of the semiconductor device and the semiconductor circuit of the third embodiment. FIG. 10 is a schematic diagram showing a voltage applied to the pin diode. FIG. 11 is an example of the timing chart of the voltage applied to the pin diode. FIG. 12 is an explanatory diagram of the reverse recovery operation of the pin diode 300.

As shown in FIG. 10, a first voltage (V1) is applied to the anode electrode 12 of the pin diode 300, a second voltage (V2) is applied to the cathode electrode 14, and a third voltage (V3) is applied to the trench gate electrode 18. The third voltage (V3) applied to the trench gate electrode 18 is controlled by, for example, the gate driver circuit 350.

As shown in FIG. 11, when the pin diode 300 is ON, a voltage is applied between the anode electrode 12 and the cathode electrode 14 so that the electric potential of the anode electrode 12 is higher than the electric potential of the cathode electrode 14. In other words, in the ON state, a voltage is applied between the anode electrode 12 and the cathode electrode 14 so that the side of the anode electrode 12 becomes positive. That is, in the ON state, a first voltage V1 applied to the anode electrode 12 is higher than a second voltage V2 applied to the cathode electrode 14.

In FIG. 11, when the pin diode 300 is ON, for example, the first voltage V1 is 0 V and the second voltage V2 is a negative voltage. In addition, a third voltage V3 applied to the trench gate electrode 18 is, for example, 0 V, which is equal to the first voltage V1.

As shown in FIG. 11, at the time of turn-off when the pin diode 300 switches from ON to OFF, the voltage between the anode electrode 12 and the cathode electrode 14 is changed so that the electric potential of the anode electrode 12 is lower than the electric potential of the cathode electrode 14. That is, at the time of turn-off, a voltage is applied between the anode electrode 12 and the cathode electrode 14 so that the side of the cathode electrode 14 becomes positive. That is, at the time of turn-off, the second voltage V2 applied to the cathode electrode 14 becomes higher than the first voltage V1 applied to the anode electrode 12.

At the time of turn-off, as the third voltage V3 applied to the trench gate electrode 18, a voltage that is negative with respect to the first voltage V1 applied to the anode electrode 12 is applied.

In FIG. 11, when the pin diode 300 is turned off and in the OFF state, for example, the first voltage V1 is 0 V and the second voltage V2 is a positive voltage. In addition, the third voltage V3 applied to the trench gate electrode 18 is a negative voltage.

When the pin diode 300 is turned off, a voltage that is negative with respect to the anode electrode 12 is applied to the trench gate electrode 18. As a result, as shown in FIG. 12, a p-type accumulation layer is formed in the semiconductor layer 10 on the side surface of the trench 20.

The formation of the p-type accumulation layer in the semiconductor layer 10 on the side surface of the trench 20 promotes the discharge of holes from the drift region 24 at the time of turn-off. Therefore, the recovery loss of the pin diode 300 is further reduced as compared with the pin diode 100 of the first embodiment.

In addition, the formation of the p-type accumulation layer in the semiconductor layer 10 on the side surface of the trench 20 also promotes the discharge of holes generated by the avalanche breakdown at the bottom of the trench 20. Therefore, according to the pin diode 300, as compared with the pin diode 100, the damage in the reverse recovery operation is further suppressed, so that the reverse recovery safe operating area can be further expanded.

In addition, the timing chart shown in FIG. 11 is an example of the operation of the pin diode 300. For example, an operation of applying a voltage equal to the anode electrode 12 or a positive voltage to the trench gate electrode 18 when the pin diode 300 is turned off is not excluded.

As described above, according to the third embodiment, it is possible to provide a pin diode having a reduced recovery loss and an expanded safe operating area and a semiconductor circuit including the pin diode.

Fourth Embodiment

A semiconductor device of a fourth embodiment is different from the semiconductor device of the first embodiment in that the semiconductor layer further includes a semiconductor region of a first conductive type between the first semiconductor region and the second face. Hereinafter, the description of a part of the content overlapping the first embodiment may be omitted.

The semiconductor device of the fourth embodiment is a pin diode 400.

Figure 13:
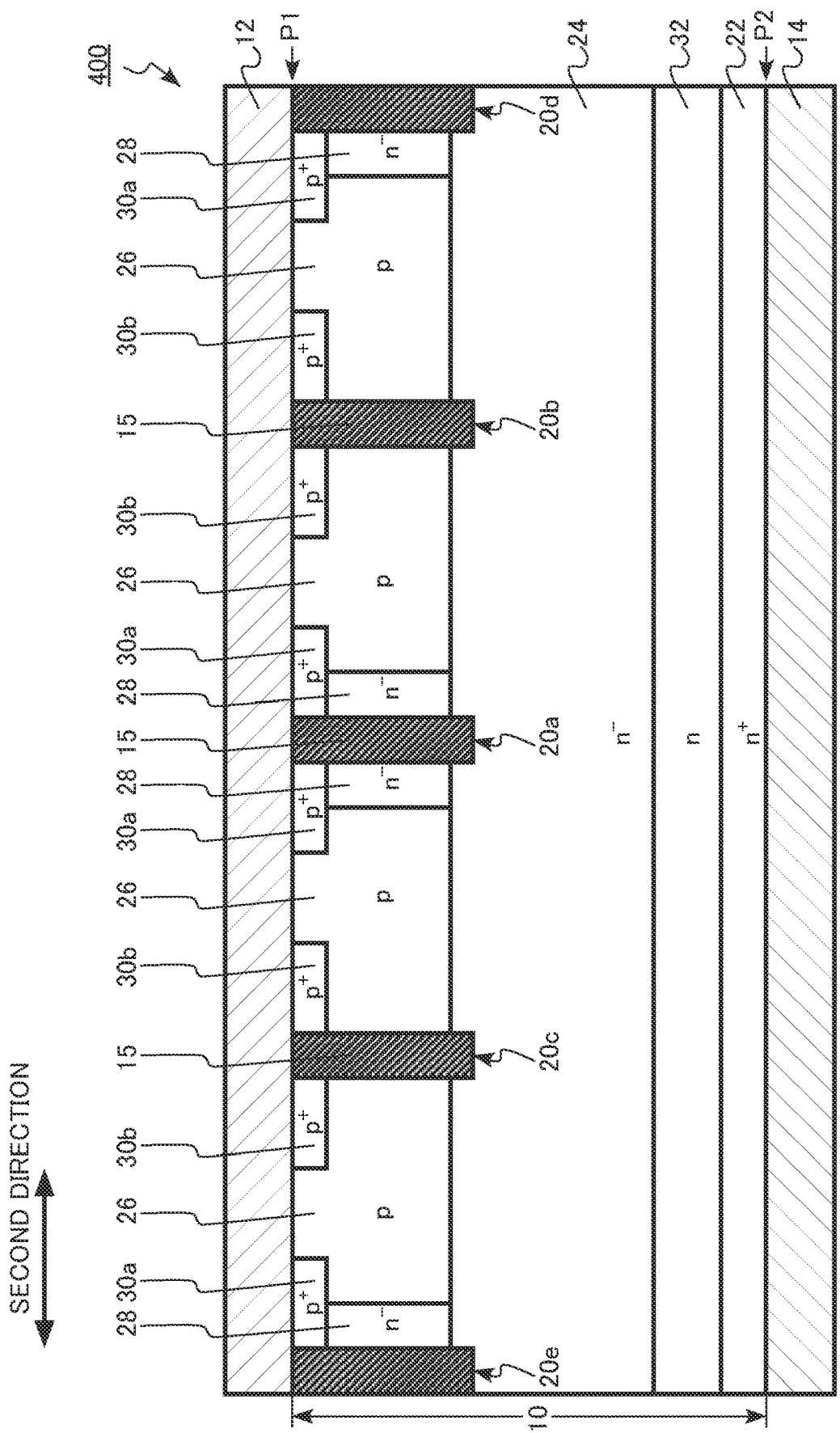
FIG. 13 is a schematic cross-sectional view of a semiconductor device of a fourth embodiment.

FIG. 13 is a schematic cross-sectional view of the semiconductor device of the fourth embodiment.

The pin diode 400 of the fourth embodiment includes a semiconductor layer 10, an anode electrode 12 (first electrode), a cathode electrode 14 (second electrode), and a trench insulating layer 15.

In the semiconductor layer 10, a trench 20a (first trench), a trench 20b (second trench), a trench 20c, a trench 20d, a trench 20e, a cathode region 22, a drift region 24 (first semiconductor region), a base region 26 (second semiconductor region), a channel region 28 (third semiconductor region), a first anode region 30a (fourth semiconductor region), a second anode region 30b (fifth semiconductor region), and a buffer region 32 are provided.

The anode electrode 12 is an example of the first electrode. The cathode electrode 14 is an example of the second electrode. The trench 20a is an example of the first trench. The trench 20b is an example of the second trench. The drift region 24 is an example of the first semiconductor region. The base region 26 is an example of the second semiconductor region. The channel region 28 is an example of the third semiconductor region. The first anode region 30a is an example of the fourth semiconductor region. The second anode region 30b is an example of the fifth semiconductor region.

The buffer region 32 is an n-type semiconductor region. The buffer region 32 is provided between the cathode region 22 and the drift region 24.

The n-type impurity concentration in the buffer region 32 is lower than the n-type impurity concentration in the cathode region 22. The n-type impurity concentration in the buffer region 32 is higher than the n-type impurity concentration in the drift region 24.

According to the pin diode 400 of the fourth embodiment, the buffer region 32 suppresses current oscillation and voltage oscillation during the reverse recovery operation.

Figure 14:
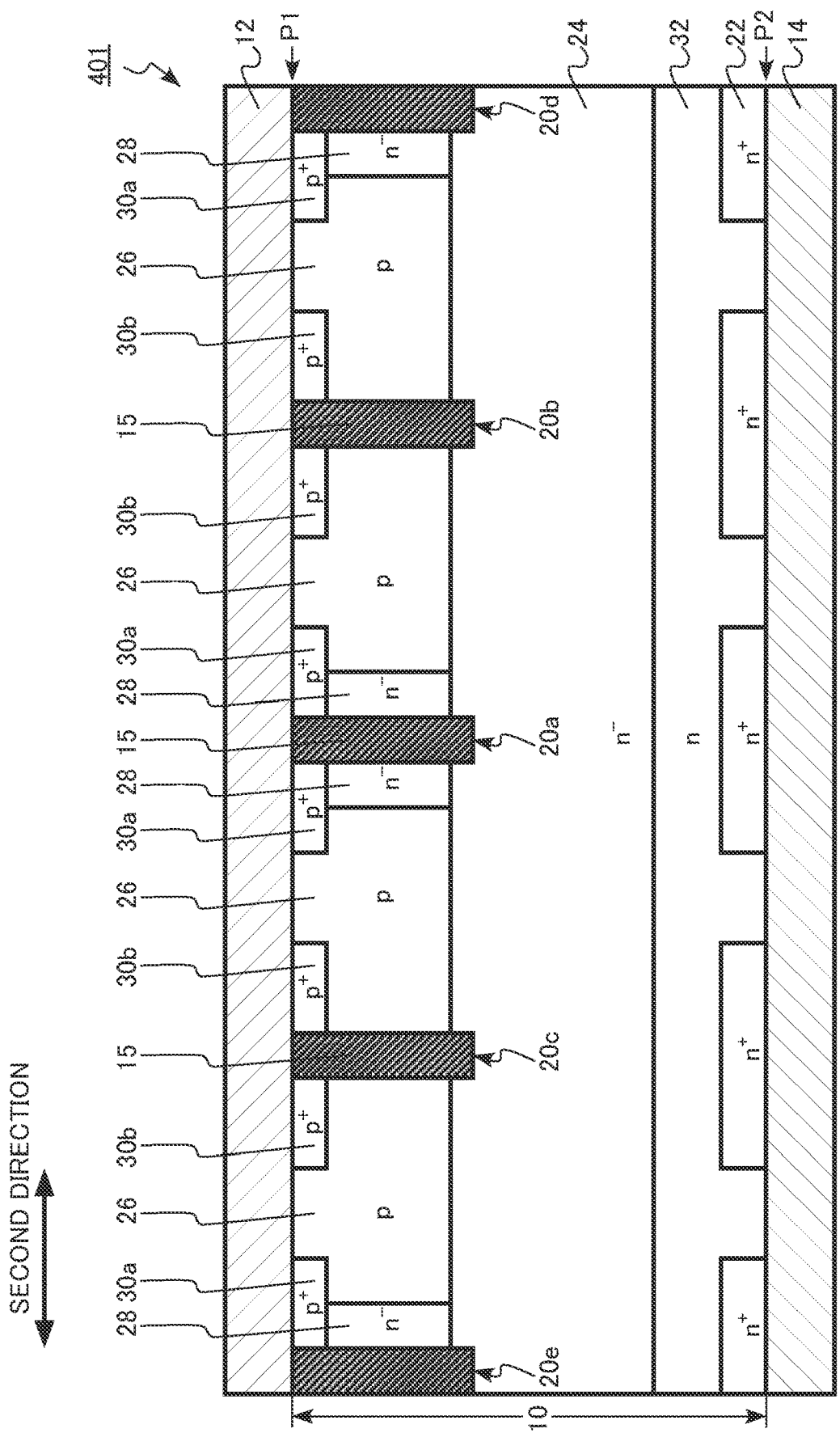
FIG. 14 is a schematic cross-sectional view of a first modification example of the semiconductor device of the fourth embodiment.

FIG. 14 is a schematic cross-sectional view of a first modification example of the semiconductor device of the fourth embodiment. The first modification example of the semiconductor device of the fourth embodiment is a pin diode 401.

The pin diode 401 is different from the pin diode 400 of the fourth embodiment in that the cathode region 22 is divided into a plurality of parts in the second direction.

The cathode electrode 14 makes ohmic contact with the cathode region 22. The cathode electrode 14 makes Schottky contact with the buffer region 32.

According to the pin diode 401 of the first modification example, the injection of electrons from the cathode electrode 14 is suppressed by dividing the cathode region 22 into a plurality of parts. Recovery loss is reduced by suppressing the injection of electrons.

FIG. 15 is a schematic cross-sectional view of a second modification example of the semiconductor device of the fourth embodiment. The second modification example of the semiconductor device of the fourth embodiment is a pin diode 402.

The pin diode 402 is different from the pin diode 401 of the first modification example of the fourth embodiment in that a p$^+$-type region 34 is provided between the divided cathode regions 22.

According to the pin diode 402 of the second modification example, holes are injected from the cathode electrode 14 into the drift region 24 through the p$^+$-type region 34 during the reverse recovery operation. Since the holes are injected into the drift region 24, current oscillation and voltage oscillation during the reverse recovery operation are suppressed.

As described above, according to the fourth embodiment and its modification examples, it is possible to provide a pin diode having a reduced recovery loss and an expanded safe operating area.

Fifth Embodiment

A semiconductor device of a fifth embodiment is different from the semiconductor device of the first embodiment in that the semiconductor device of the fifth embodiment is an RC-IGBT including the pin diode of the first embodiment. Hereinafter, the description of a part of the content overlapping the first embodiment will be omitted.

The semiconductor device of the fifth embodiment is an RC-IGBT 500 in which an IGBT and a freewheeling diode are formed in the same semiconductor chip. The RC-IGBT 500 has a trench gate type IGBT including a gate electrode in a trench formed in a semiconductor layer. The RC-IGBT 500 includes the pin diode 100 of the first embodiment as a freewheeling diode.

Hereinafter, a case where the first conductive type is the n type and the second conductive type is the p type will be described as an example.

FIG. 16 is a schematic cross-sectional view of the semiconductor device of the fifth embodiment.

The RC-IGBT 500 of the fifth embodiment has an IGBT region 501 and a diode region 502. The diode region 502 includes the pin diode 100 of the first embodiment.

The IGBT region 501 operates as an IGBT. The diode region 502 operates as a freewheeling diode.

The RC-IGBT 500 of the fifth embodiment includes a semiconductor layer 10, an upper electrode 62 (first electrode), a lower electrode 64 (second electrode), a gate insulating film 41, a gate electrode 51, an interlayer insulating layer 61, and a trench insulating layer 15.

In the semiconductor layer 10 of the IGBT region 501, a gate trench 71, a p$^+$-type collector region 78, an n$^-$-type drift region 24, a p-type body region 74, an n-type emitter region 76, and a p-type contact region 80 are provided.

In the semiconductor layer 10 of the diode region 502, a trench 20a (first trench), a trench 20b (second trench), a trench 20c, a cathode region 22, a drift region 24 (first semiconductor region), a base region 26 (second semiconductor region), a channel region 28 (third semiconductor region), a first anode region 30a (fourth semiconductor region), and a second anode region 30b (fifth semiconductor region) are provided.

In the IGBT region 501, the upper electrode 62 functions as an emitter electrode of the IGBT. In the diode region 502, the upper electrode 62 functions as an anode electrode of the diode.

In the IGBT region 501, the lower electrode 64 functions as a collector electrode of the IGBT. In the diode region 502, the lower electrode 64 functions as a cathode electrode of the diode.

The gate electrode 51 functions as a gate electrode of the transistor of the IGBT. A gate voltage (Vg) is applied to the gate electrode 51.

The RC-IGBT 500 includes a pin diode, which has a reduced recovery loss and an expanded safe operating area, in the same semiconductor chip. Therefore, it is possible to realize the RC-IGBT 500 having a reduced recovery loss and an expanded safe operating area.

As described above, according to the fifth embodiment, it is possible to provide an RC-IGBT having a reduced recovery loss and an expanded safe operating area.

In the first to fifth embodiments, the case where the semiconductor layer is single crystal silicon has been described as an example. However, the semiconductor layer is not limited to the single crystal silicon. For example, other single crystal semiconductors, such as single crystal silicon carbide, may be used.

In addition, in the first to fifth embodiments, the case where the first conductive type is the n type and the second conductive type is the p type has been described as an example. However, the first conductive type can be the p type and the second conductive type can be the n type. Assuming that the first conductive type is the p type and the second conductive type is the n type, for example, in the pin diode 300 of the third embodiment, at the time of turn-off, as the third voltage V3 applied to the trench gate electrode 18, a voltage that is positive with respect to the first voltage V1 applied to the anode electrode 12 is applied.

In the fifth embodiment, the configuration in which the RC-IGBT includes the pin diode of the first embodiment has been described as an example. However, it is also possible to adopt a configuration in which the RC-IGBT includes the pin diode of each of the second to fourth embodiments.

While certain embodiments have been described, these embodiments have been presented by way of example only, and are not intended to limit the scope of the inventions. Indeed, the semiconductor device and the semiconductor circuit described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor layer having a first face and a second face opposite to the first face and including:
a first trench provided in a first face side;
a second trench provided in a first face side;
a first semiconductor region of a first conductive type in contact with the first trench and the second trench;
a second semiconductor region of a second conductive type provided between the first face and the first semiconductor region, the second semiconductor region provided between the first trench and the second trench, and the second semiconductor region being physically in contact with the second trench;
a third semiconductor region of a first conductive type provided between the first semiconductor region and the first face, the third semiconductor region provided between the first trench and the second semiconductor region, the third semiconductor region being in contact with the first trench, the third semiconductor region being separated from the second trench, the third semiconductor region being in contact with the second semiconductor region, and the third semiconductor region being physically in contact with the first semiconductor region;
a fourth semiconductor region of a second conductive type provided between the third semiconductor region and the first face, the fourth semiconductor region provided between the first trench and the second semiconductor region, the fourth semiconductor region being physically in contact with the first trench, the fourth semiconductor region being physically in contact with the second semiconductor region, the fourth semiconductor region being physically in contact with the third semiconductor region, and the fourth semiconductor region having a second conductive type impurity concentration higher than a second conductive type impurity concentration in the second semiconductor region; and
a fifth semiconductor region of a second conductive type provided between the second semiconductor region and the first face, the fifth semiconductor region being physically in contact with the second trench, and the fifth semiconductor region having a second conductive type impurity concentration higher than the second conductive type impurity concentration in the second semiconductor region, and the second semiconductor region being provided between the fourth semiconductor region and the fifth semiconductor region;
a first electrode provided on the first face side of the semiconductor layer and in contact with the second semiconductor region, the fourth semiconductor region, and the fifth semiconductor region; and
a second electrode provided on a second face side of the semiconductor layer,
wherein a distance between the first trench and the second trench is larger than a depth of the first trench.

2. The semiconductor device according to claim 1, wherein a first conductive type impurity concentration in the third semiconductor region is higher than a first conductive type impurity concentration in the first semiconductor region.

3. The semiconductor device according to claim 1, wherein a material of a first portion of the first electrode in contact with the second semiconductor region is different from a material of a second portion of the first electrode in contact with the fourth semiconductor region.

* * * * *